(12) United States Patent
Wu et al.

(10) Patent No.: US 11,387,164 B2
(45) Date of Patent: Jul. 12, 2022

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Chung-Jung Wu, Hsinchu (TW); Chih-Hang Tung, Hsinchu (TW); Tung-Liang Shao, Hsinchu (TW); Sheng-Tsung Hsiao, Hsinchu (TW); Jen-Yu Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 71 days.

(21) Appl. No.: 16/798,431

(22) Filed: Feb. 24, 2020

(65) Prior Publication Data

US 2021/0066164 A1 Mar. 4, 2021

Related U.S. Application Data

(60) Provisional application No. 62/892,560, filed on Aug. 28, 2019.

(51) Int. Cl.
*H01L 23/46* (2006.01)
*H01L 21/52* (2006.01)
(Continued)

(52) U.S. Cl.
CPC ............ *H01L 23/46* (2013.01); *H01L 21/52* (2013.01); *H01L 23/4006* (2013.01);
(Continued)

(58) Field of Classification Search
CPC ...... H01L 23/42; H01L 23/46; H01L 23/4006; H01L 23/473; H01L 23/49827; H01L 21/52
(Continued)

(56) References Cited

U.S. PATENT DOCUMENTS 6,771,500 B1 8/2004 Siegel et al.
8,921,992 B2 * 12/2014 Koontz ............... H01L 23/367
257/686

(Continued)

FOREIGN PATENT DOCUMENTS

JP H06224338 8/1994
JP H06268109 9/1994
(Continued)

OTHER PUBLICATIONS

"Office Action of Taiwan Counterpart Application", dated Dec. 31, 2020, p. 1-p. 5.
(Continued)

*Primary Examiner* — David Vu
*Assistant Examiner* — Brandon C Fox
(74) *Attorney, Agent, or Firm* — JCIPRNET

(57) ABSTRACT

A semiconductor device includes a package and a cooling cover. The package includes a first die having an active surface and a rear surface opposite to the active surface. The rear surface has a cooling region and a peripheral region enclosing the cooling region. The first die includes microtrenches located in the cooling region of the rear surface. The cooling cover is stacked on the first die. The cooling cover includes a fluid inlet port and a fluid outlet port located over the cooling region and communicated with the microtrenches.

20 Claims, 20 Drawing Sheets

(51) Int. Cl.
  *H01L 23/40* (2006.01)
  *H01L 23/498* (2006.01)
  *H01L 23/473* (2006.01)
  *H01L 23/42* (2006.01)
(52) U.S. Cl.
  CPC ............ *H01L 23/42* (2013.01); *H01L 23/473* (2013.01); *H01L 23/49827* (2013.01); *H01L 2023/4087* (2013.01)
(58) Field of Classification Search
  USPC ........................................................ 257/713
  See application file for complete search history.

(56) References Cited

U.S. PATENT DOCUMENTS

| | | | |
|---|---|---|---|
| 8,993,380 | B2 | 3/2015 | Hou et al. |
| 9,224,673 | B2 | 12/2015 | Chen et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 10,020,243 | B2 * | 7/2018 | Fukuoka ............. H01L 23/3677 |
| 2004/0182560 | A1 * | 9/2004 | Kenny .................. F28F 3/086 165/185 |
| 2007/0063337 | A1 * | 3/2007 | Schubert ............... H01L 23/473 257/714 |
| 2009/0316360 | A1 | 12/2009 | Campbell et al. |
| 2012/0306088 | A1 * | 12/2012 | Bartley ............... H01L 25/0657 257/773 |
| 2014/0027895 | A1 | 1/2014 | Mizuno et al. |
| 2014/0264759 | A1 | 9/2014 | Koontz et al. |
| 2016/0165755 | A1 * | 6/2016 | Bodenweber ........... H01L 23/46 165/80.2 |
| 2018/0151472 | A1 | 5/2018 | Chen et al. |
| 2020/0294968 | A1 * | 9/2020 | Sikka .................. H01L 29/16 |
| 2020/0411439 | A1 * | 12/2020 | Teng .................. H01L 23/3677 |

FOREIGN PATENT DOCUMENTS

| | | |
|---|---|---|
| JP | 2002093960 | 3/2002 |
| JP | 5725163 | 5/2015 |
| WO | 2019066901 | 4/2019 |
| WO | 2019204472 | 10/2019 |

OTHER PUBLICATIONS

"Office Action of Korea Counterpart Application", dated Oct. 1, 2021, p. 1-p. 6.
"Office Action of German Counterpart Application," dated Apr. 27, 2022, p. 1-p. 6.

* cited by examiner

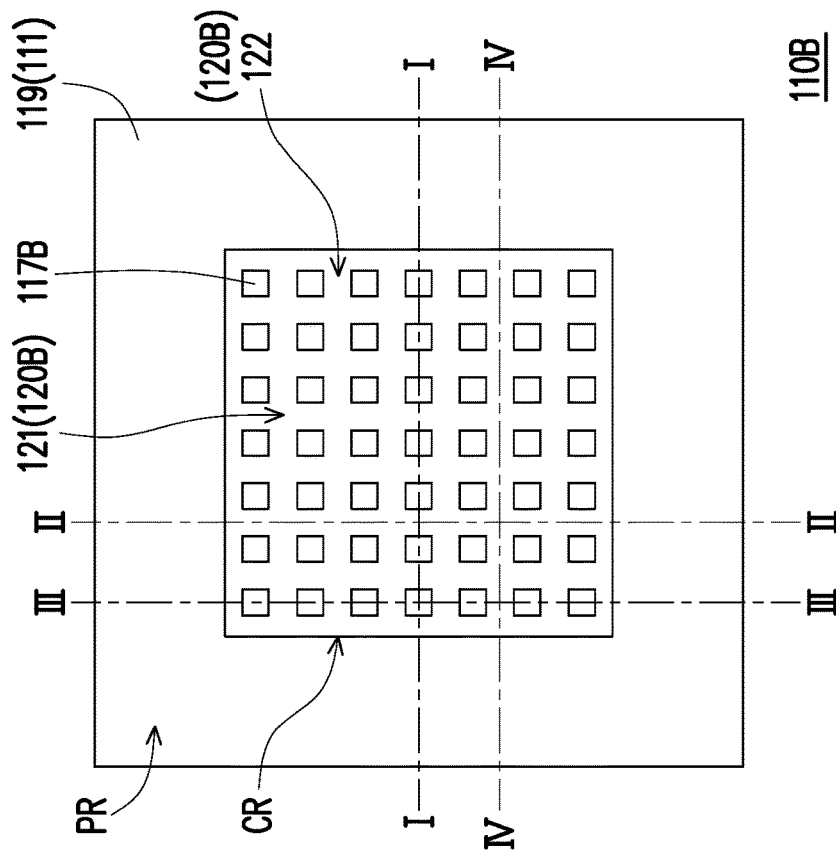
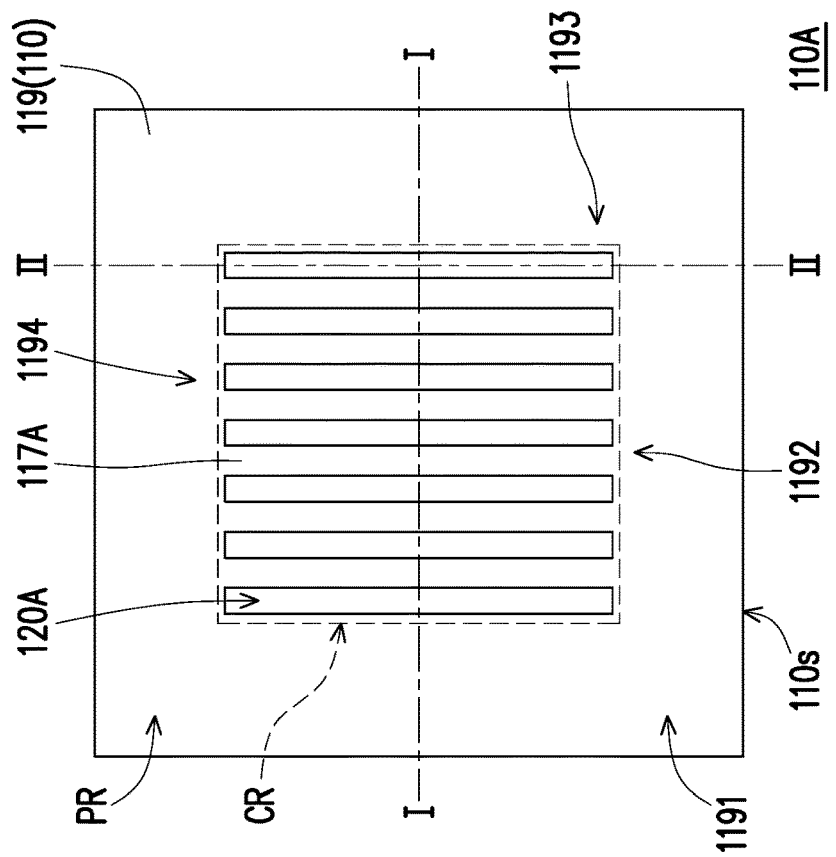
FIG. 2B
FIG. 2A

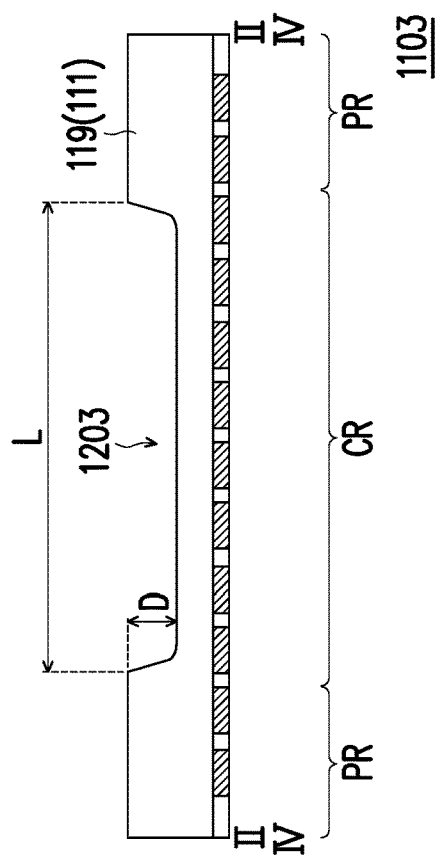
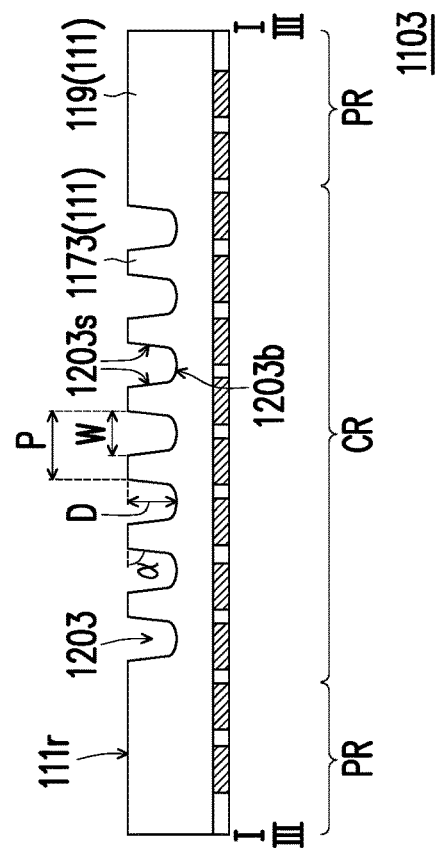
FIG. 6A
FIG. 6B

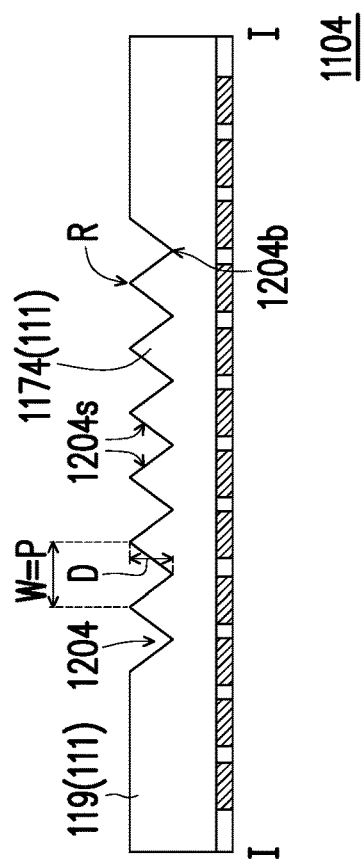
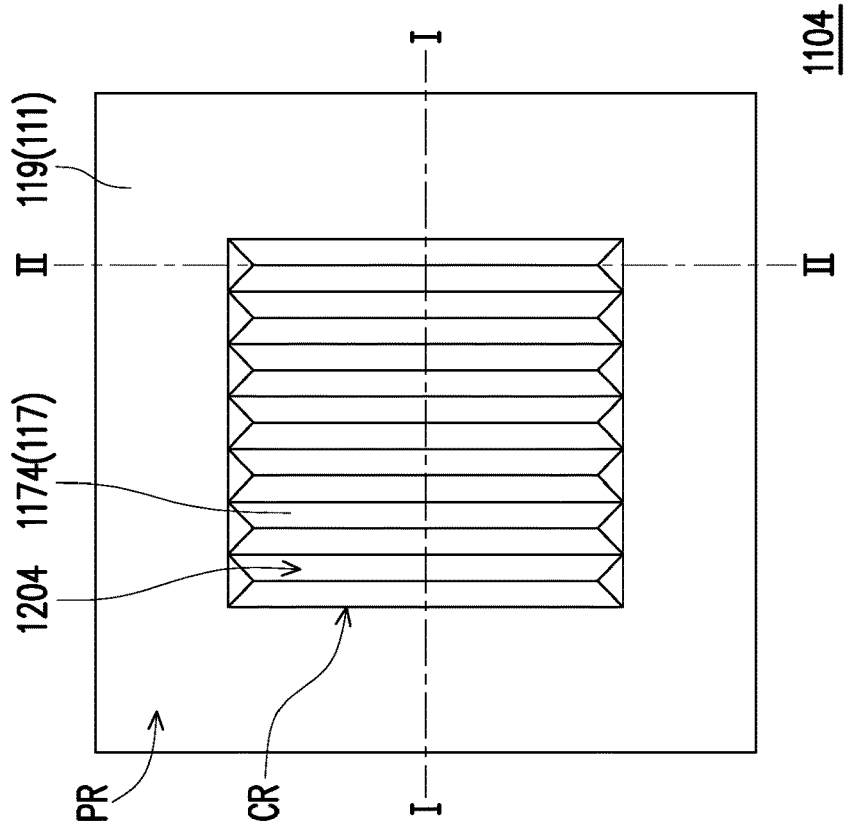
FIG. 7B
FIG. 7A

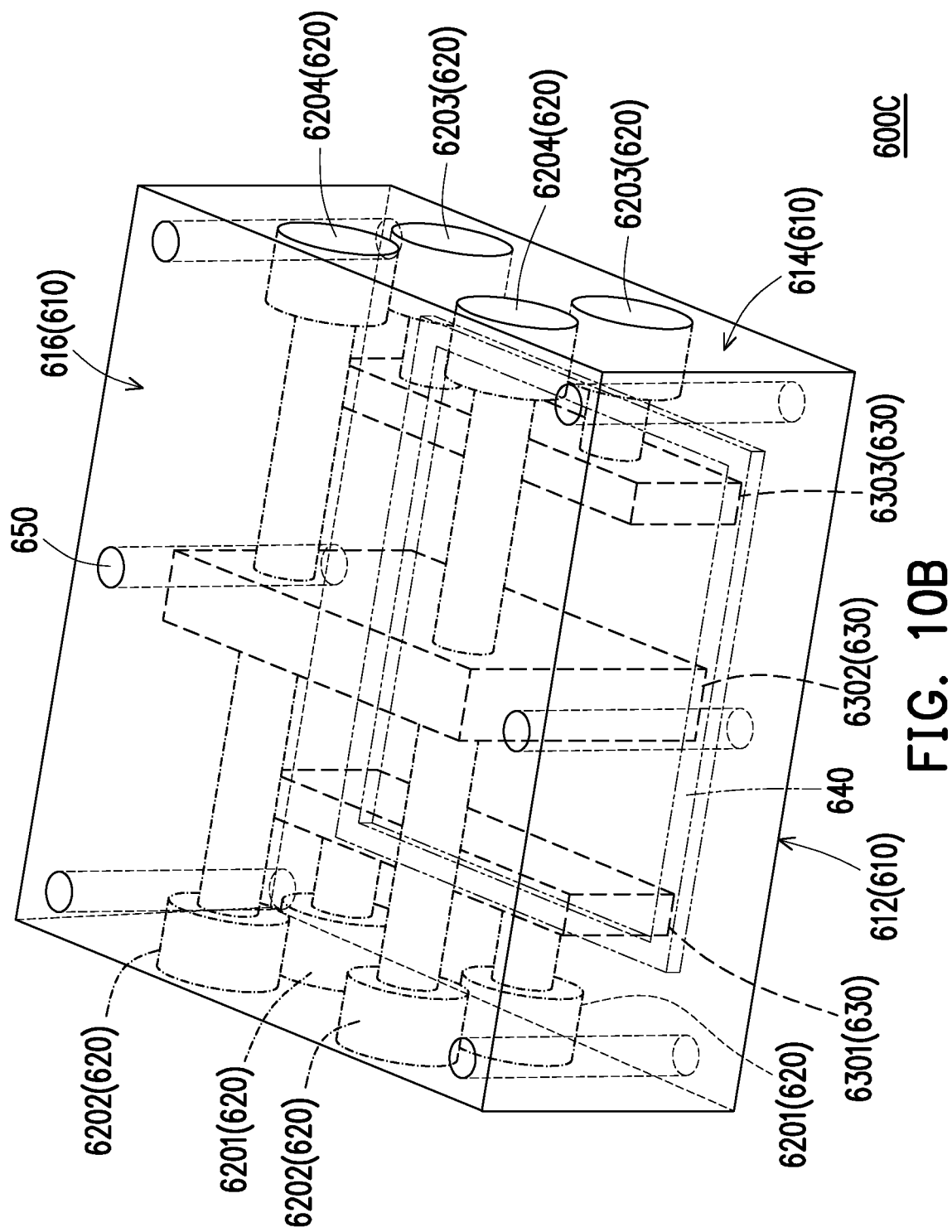

SEMICONDUCTOR DEVICE AND MANUFACTURING METHOD THEREOF

CROSS-REFERENCE TO RELATED APPLICATION

This application claims the priority benefit of U.S. provisional application Ser. No. 62/892,560, filed on Aug. 28, 2019. The entirety of the above-mentioned patent application is hereby incorporated by reference herein and made a part of this specification.

BACKGROUND

As electronic products are continuously miniaturized, heat dissipation of the packaged die(s) has become an important issue for packaging technology. In addition, for multi-die packages, the arrangement of the dies has impact on data transmission speed among dies and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A and FIG. 2B are respectively schematic top views of dies according to some embodiments of the present disclosure.

FIG. 6A and FIG. 6B are respectively schematic cross-sectional views of a die according to some embodiments of the present disclosure.

FIG. 7A is a schematic top view of a die according to some embodiments of the present disclosure.

FIG. 7B through FIG. 7D are respectively schematic cross-sectional views of a die according to some embodiments of the present disclosure.

FIG. 10A through FIG. 10D are respectively schematic perspective views of cooling covers according to some embodiments of the present disclosure.

DESCRIPTION OF THE EMBODIMENTS

Figure 1A:
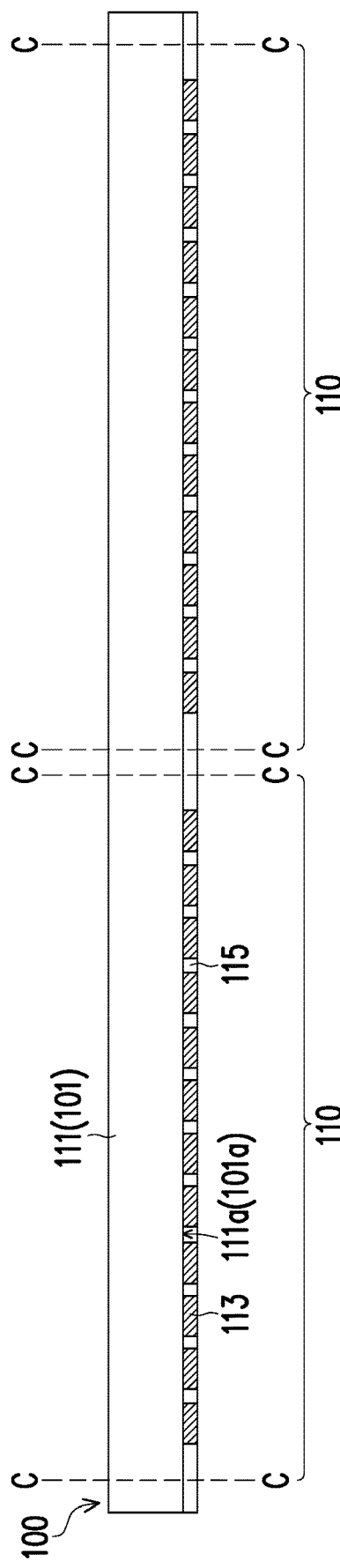
FIG. 1A through FIG. 1F are schematic cross-sectional views illustrating structures formed at various stages of a manufacturing method of a package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1F are schematic cross-sectional views illustrating structures formed at various stages of a manufacturing method of a package 10 according to some embodiments of the present disclosure. Referring to FIG. 1A, a semiconductor wafer 100 is provided. In some embodiments, the semiconductor wafer 100 may be divided into multiple dies 110. In some embodiments, the semiconductor wafer 100 may be a wafer made of semiconductor materials, such as semiconductor materials of the groups III-V of the periodic table. In some embodiments, the semiconductor wafer 100 may include elementary semiconductor materials such as silicon or germanium, compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. For example, the semiconductor wafer 100 may be a silicon bulk wafer. In some embodiments, the dies 110 are parts of the semiconductor wafer 100 and sidewalls of each die 100 extend along the cut lines C-C. Each die 110 may include a semiconductor substrate 111, which is a portion of the semiconductor substrate 101 of the semiconductor wafer 100. A plurality of contact pads 113 and a passivation layer 115 may be formed on a frontside surface 101a of the semiconductor wafer 100. In FIG. 1A, two dies 110 are illustrated to represent multiple dies 110 formed in the semiconductor wafer 100, but more than two dies 110 may be formed in the semiconductor wafer 100. Each of the dies 110 may include active components (e.g., transistors or the like) and, optionally, passive components (e.g., resistors, capacitors, inductors, or the like) formed in the semiconductor substrate 111. Each of the dies 110 may be a logic die, such as a central processing unit (CPU) die, a graphic processing unit (GPU) die, a micro control unit (MCU) die, an input-output (I/O) die, a baseband (BB) die, or an application processor (AP) die. In some alternative embodiments, the dies 110 may be a memory die such as a high bandwidth memory die.

In some embodiments, the contact pads 113 are formed on an active surface 111a of the semiconductor substrate 111 of each die 110. That is, each active surface 111a may correspond to a portion of the frontside surface 101a of the semiconductor substrate 101 of the semiconductor wafer 100. In certain embodiments, the contact pads 113 include aluminum pads, copper pads, or other suitable metal pads. As illustrated in FIG. 1A, the passivation layer 115 extends over the frontside surface 101a of the semiconductor wafer 100. In some embodiments, the passivation layer 115 is formed with openings revealing the contact pads 113. In some embodiments, the passivation layer 115 may be a single layer or a multi-layered structure, including a silicon oxide layer, a silicon nitride layer, a silicon oxy-nitride layer, a dielectric layer formed by other suitable dielectric materials, or combinations thereof. The contact pads 113 may be at least partially exposed by the openings of the passivation layer 115.

Figure 1B:
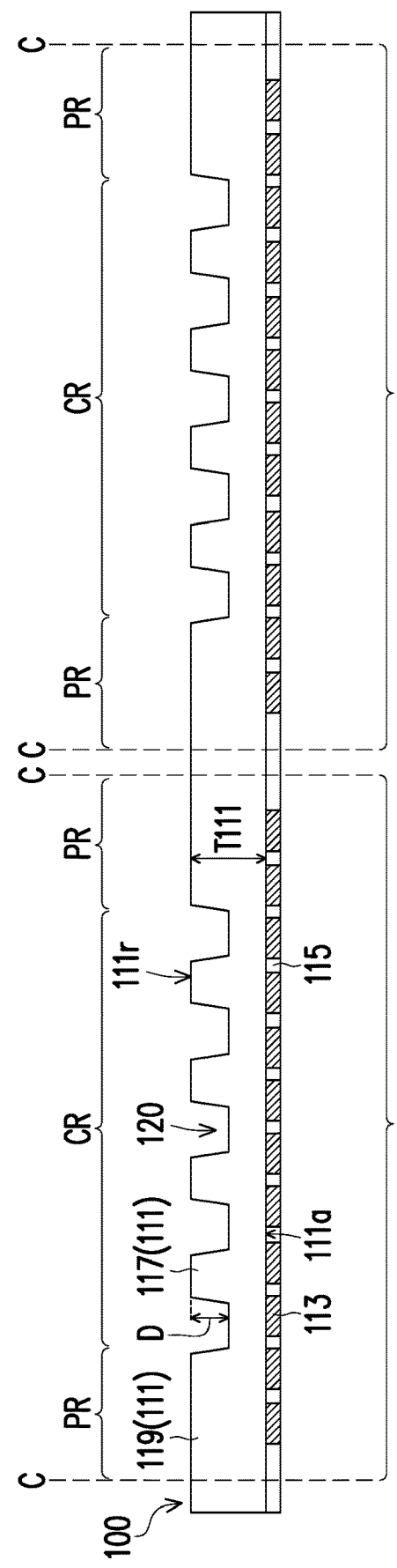

Referring to FIG. 1B, in some embodiments, micro-trenches 120 are formed on a rear surface 111r of the semiconductor substrate 111 opposite to the active surface 111a. In some embodiments, the micro-trenches 120 are formed by removing portions of the semiconductor substrates 111. In some embodiments, the micro-trenches 120 may be formed via an etching process. In some embodiments, the etching process includes a dry etching process or a wet etching process. In some alternative embodiments, the micro-trenches 120 may be formed via a cutting process. In some embodiments, a laser saw or a mechanical die saw may be employed for the cutting process. In some embodiments, by forming the micro-trenches 120 via an etching process or a cutting process, the micro-trenches 120 may be formed in a cost-effective manner. In some embodiments, with the formation of the micro-trenches 120, a plurality of discontinuous patterns 117 may be formed simultaneously on the rear surfaces 111r of the dies 110. For example, the discontinuous patterns 117 are located between two adjacent micro-trenches 120. In some embodiments, the discontinuous patterns 117 are semiconductor micro-structures which remain on the rear surfaces 111r of the dies 110 after portions of semiconductor substrates 111 are removed to form the micro-trenches 120. In some embodiments, the micro-trenches 120 partially penetrate the semiconductor substrates 111, and portions of the semiconductor substrates 111 may be exposed at the sides and at the bottom of the micro-trenches 120. That is, a depth D of the micro-trenches 120 (a distance from the level height of the rear surface 111r and the bottom of the micro-trenches 120) may be smaller than a maximum thickness T111 of the semiconductor substrate 111. In some embodiments, the discontinuous patterns 117 are enclosed by a continuous ring pattern 119. In some embodiments, the discontinuous patterns 117 are located in a cooling region CR of the die 110, and the continuous ring pattern 119 is located in a peripheral region PR encircling the cooling region CR. In some embodiments, the maximum thickness T111 may correspond to the thickness of the peripheral region PR (in correspondence of the continuous ring pattern 119).

Figure 1C:
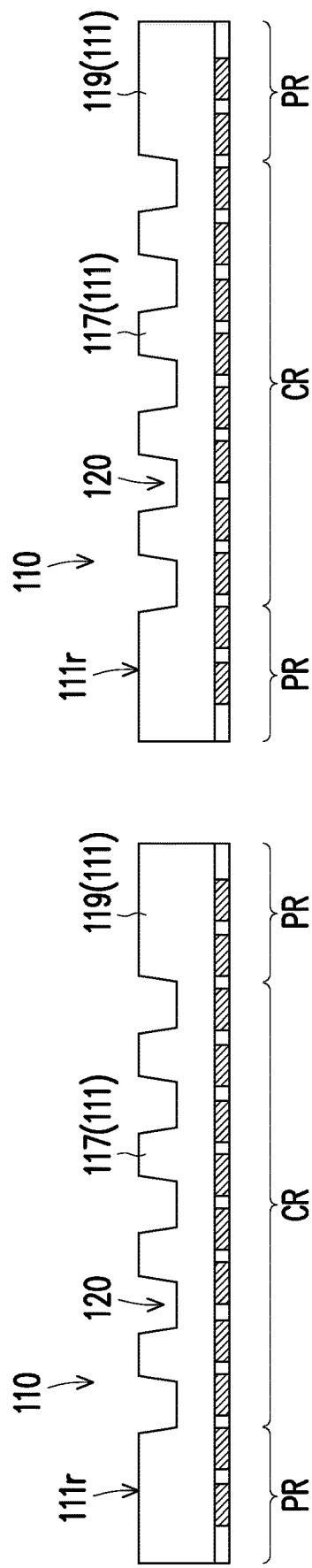

Referring to FIG. 1B and FIG. 1C, a singulation process is performed on the semiconductor wafer 100 to separate the individual dies 110. For example, the semiconductor wafer 100 is cut throughout its entire thickness along the cut lines CC arranged between individual dies 110. In some embodiments, the singulation process typically involves performing a wafer dicing process with a mechanical die saw and/or a laser saw.

Figure 1D:
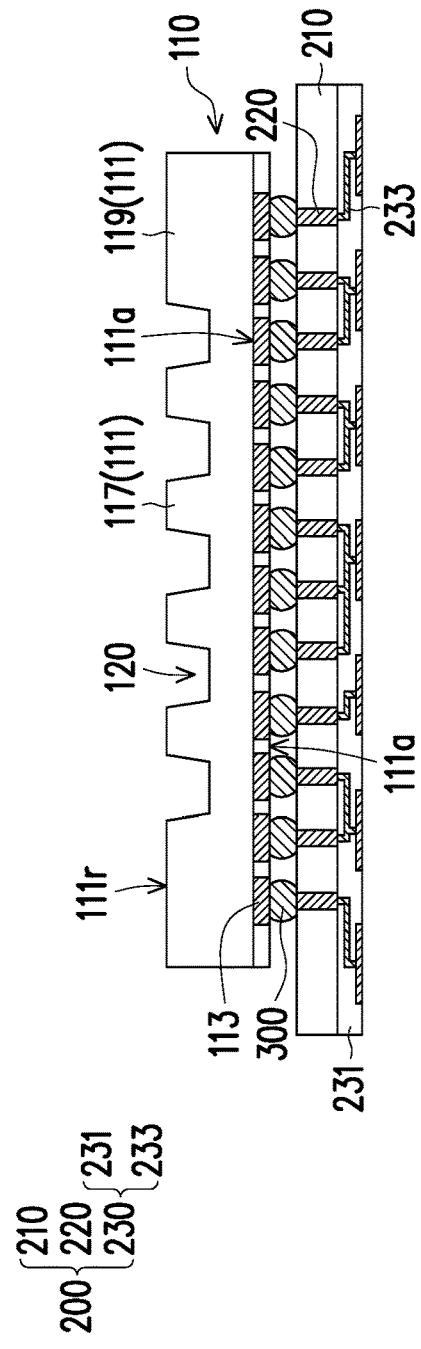

Referring to FIG. 1D, the die 110 is bonded to an interposer 200. In some embodiments, the interposer 200 includes a semiconductor substrate 210, through semiconductor vias (TSVs) 220 formed in the semiconductor substrate 210, and an interconnection structure 230 formed on a side of the semiconductor substrate 210. The semiconductor substrate 210 may be made of the same material as that of the semiconductor substrate 111 of the dies 110, so the detailed description thereof is omitted herein. In some embodiments, the interposer 200 includes a silicon wafer.

In some embodiments, the interconnection structure 230 is disposed on the semiconductor substrate 210 and includes a dielectric layer 231 and conductive traces 233 extending through the dielectric layer 231. For simplicity, the dielectric layer 231 is illustrated as a single dielectric layer and the conductive traces 233 are illustrated as embedded in the dielectric layer 231. Nevertheless, from the perspective of the manufacturing process, the dielectric layer 231 is constituted by at least two dielectric layers. The conductive traces 233 may be sandwiched between two adjacent dielectric layers. Some of the conductive traces 233 may extend vertically through the dielectric layer 231 to establish electrical connection between different metallization tiers of the interconnection structure 230. In some embodiments, the outermost dielectric layer 231 (when multiple dielectric layers are presented in the dielectric layer 231) may be patterned to expose the underlying conductive traces 233. In some embodiments, the material of the dielectric layer 231 includes polyimide, epoxy resin, acrylic resin, phenol resin, benzocyclobutene (BCB), polybenzooxazole (PBO), or any other suitable polymer-based dielectric material. The dielectric layer 231, for example, may be formed by suitable fabrication techniques such as spin-on coating, chemical vapor deposition (CVD), plasma-enhanced chemical vapor deposition (PECVD), or the like. In some embodiments, a material of the conductive traces 233 include aluminum, titanium, copper, nickel, tungsten, or alloys thereof. The conductive traces 233 may be formed by, for example, electroplating, deposition, and/or photolithography and etching. It should be noted that the number of the dielectric layers 231 and the number of the conductive traces 233 illustrated in FIG. 1D are merely for illustrative purposes, and the disclosure is not limited thereto. In some alternative embodiments, fewer or more layers of the dielectric layers 231 or conductive traces 233 may be formed depending on the circuit design.

As illustrated in FIG. 1D, the TSVs 220 are formed in the semiconductor substrate 210 to provide dual-side electrical connection. In some embodiments, one end of a TSV 220 is connected to the conductive traces 233 of the interconnection structure 230 and the other end is connected to the die 110 via a conductive terminal 300. In some embodiments, a material of the TSVs 220 includes one or more metals. For example, the metal material of the TSVs 220 includes copper, titanium, tungsten, aluminum, combinations thereof, or the like.

In some embodiments, the die 110 is bonded to the interposer 200 via the conductive terminals 300. In some embodiments, the conductive terminals 300 are micro-bumps installed on the TSVs 220 and/or the contact pads 113. In some embodiments, the die 110 is disposed with the active surface 111a (the surface on which the contact pads 113 are formed) facing the interposer 200. That is, the rear surface 111r having the micro-trenches 120 formed thereon faces away from the interposer 200. In some embodiments, the rear surface 111r is referred to as an upper surface of the die 110.

Figure 1E:
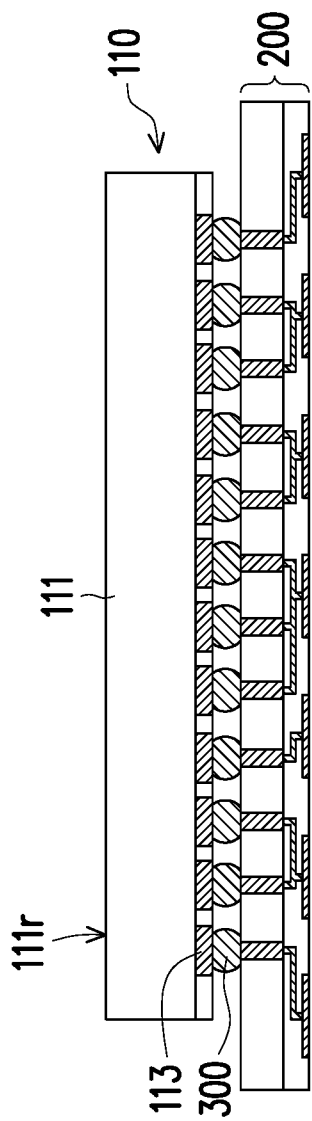

Although FIG. 1A through FIG. 1D illustrated that the die 110 is bonded to the interposer 200 after the rear surface 111r has been patterned to form the micro-trenches 120, the disclosure is not limited thereto. In some alternative embodiments, the die 110 may be placed on the interposer 200 before the portions of semiconductor substrate 111 are removed to form the micro-trenches 120, as illustrated in FIG. 1E. Subsequently, the micro-trenches 120 may be formed on the rear surface 111r to obtain the structure illustrated in FIG. 1D. That is, in some embodiments the micro-trenches 120 may be formed after bonding the die 110 to the interposer 200.

Figure 1F:
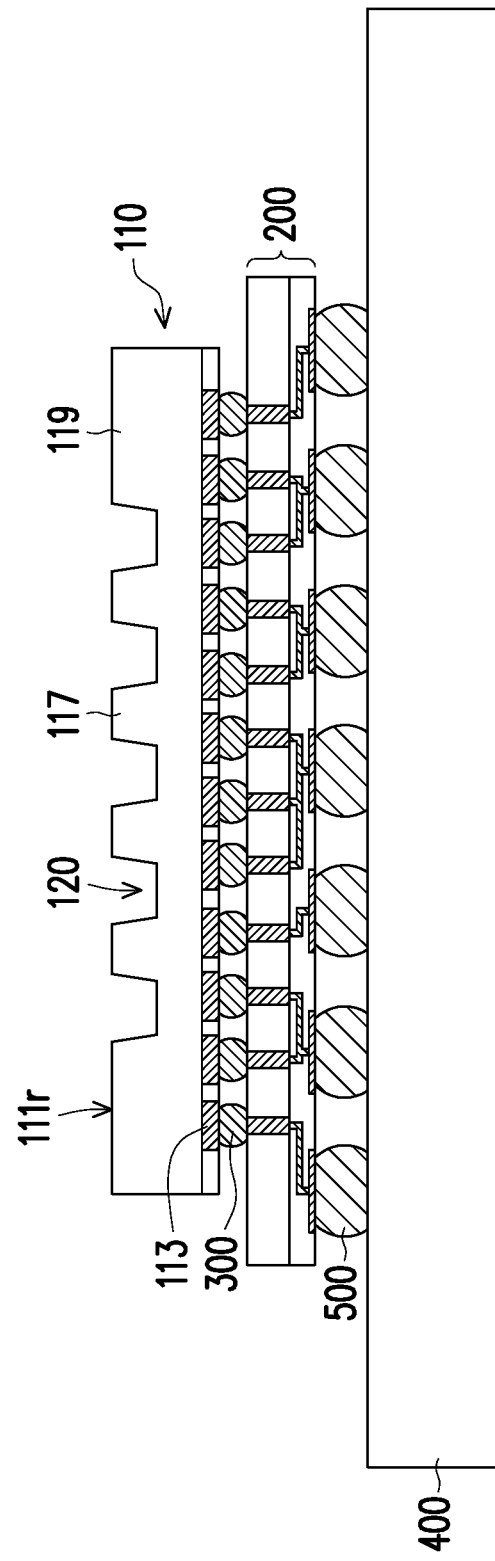

Referring to FIG. 1F, the structure illustrated in FIG. 1D is placed on a substrate 400 to obtain a package 10. For example, the interposer 200 with the die 110 bonded on top may be connected to the substrate 400, such as a printed circuit board, a mother board, or the like. In some embodiments, the interposer 200 is disposed between the die 110 and the substrate 400. As illustrated in FIG. 1F, a plurality of connective terminals 500 is formed between the interposer 200 and the substrate 400 to establish electrical connection between the interposer 200 and the substrate 400. In some embodiments, the connective terminals 500 may be C4 (controlled collapse chip connection) bumps. In some embodiments, the interposer 200 may be secured to the substrate 400 via a reflowing process or the like. In some embodiments, the package 10 may be referred to as a chip on wafer on substrate (CoWoS) package.

FIG. 2A and FIG. 2B are respectively schematic top views of the dies 110A, 110B. In some embodiments, the die 110 of the package 10 in FIG. 1F may be replaced by the die 110A or the die 110B. Referring to FIG. 2A, the die 110A has a cooling region CR encircled by a peripheral region PR. In some embodiments, strip micro-trenches 120A are formed in the cooling region CR. In some embodiments, the strip micro-trenches 120A are parallel to each other. In some embodiments, the strip micro-trenches 120A are also parallel to one of the edges 110s of the die 110A. In some embodiments, the die 110A has strip patterns 117A between two adjacent strip micro-trenches 120A and a continuous ring pattern 119 surrounding the micro-trenches 120A and the strip patterns 117A. In some embodiments, the strip patterns 117A correspond to the discontinuous patterns 117 in FIG. 1F. In some embodiments, the strip patterns 117A are located in the cooling region CR and the continuous ring pattern 119 is located in the peripheral region PR. In some embodiments, the strip patterns 117A are connected to the continuous ring pattern 119. For example, in the top view of FIG. 2A, the continuous ring pattern 119 may be divided into four sections 1191, 1192, 1193, and 1194 joining together to form a square ring pattern. In some embodiments, the strip patterns 117A are connected to the section 1192 and the section 1194.

Referring to FIG. 2B, the die 110B has a cooling region CR encircled by a peripheral region PR. In some embodiments, meshed micro-trenches 120B are formed in the cooling region CR. In some embodiments, the die 110B has micro-pillars 117B surrounded by the meshed micro-trenches 120B and a continuous ring pattern 119 surrounding the meshed micro-trenches 120B and the micro-pillars 117B. In some embodiments, the micro-pillars 117B correspond to the discontinuous patterns 117 in FIG. 1F. In some embodiments, the micro-pillars 117B are located in the cooling region CR and the continuous ring pattern 119 is located in the peripheral region PR. In some embodiments, the micro-pillars 117B are arranged in an array and are spaced apart from the continuous ring pattern 119. In some embodiments, the micro-pillars 117B are spaced apart from each other by the meshed micro-trenches 120B. In some embodiments, the meshed micro-trenches 120B may be formed by micro-trenches 121 extending along a first direction, and micro-trenches 122 extending along a second direction intersecting the first direction. In some embodiments, the first direction and the second direction may be perpendicular with respect to each other, but the disclosure is not limited thereto. In some embodiments, additional micro-trenches (not shown) extending along additional directions intersecting the first direction and the second direction may also be included.

Figure 3C:
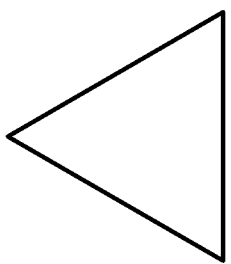
FIG. 3A through FIG. 3C are respectively schematic top views of micro-pillars according to some embodiments of the present disclosure.
Figure 3B:
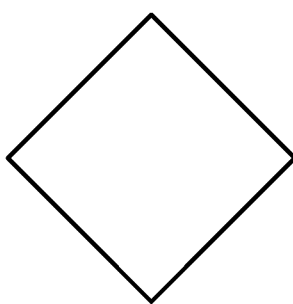
Figure 3A:
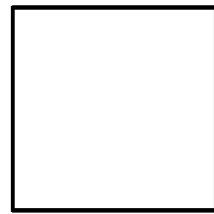

In some embodiments, the micro-pillars 117B may be formed in different shapes. FIG. 3A through FIG. 3C are respectively schematic top views of micro-pillars 117B1, 117B2, and 117B3 according to some embodiments of the present disclosure. Referring to FIG. 3A, the micro-pillars 117B1 may be squared patterns from a top view, and may be referred to as squared micro-pillars. Referring to FIG. 3B, micro-pillars 117B2 may be diamond-shaped patterns from a top view, and may be referred to as diamond micro-pillars. Referring to FIG. 3C, micro-pillars 117B3 may have be triangular patterns from a top view, and may be referred to as triangular micro-pillars. It should be noted that the disclosure is not limited thereto. In some alternative embodiments, the micro-pillars 117B of FIG. 2B may take forms different from the shapes illustrated in FIG. 3A through FIG. 3C. In addition, although FIG. 2B illustrated that the die 110B includes micro-pillars 117B with the same shape, the disclosure is not limited thereto. In some alternative embodiments, the die 110B may include micro-pillars 117B having different shapes. For example, a combination of squared micro-pillars 117B1 and triangular micro-pillars 117B3 may be simultaneously seen in the die 110B.

FIG. 4A and FIG. 4B, FIG. 5A and FIG. 5B, and FIG. 6A and FIG. 6B are respectively schematic cross-sectional views of dies 1101, 1102, and 1103 according to some embodiments of the disclosure. In some embodiments, the die 110 of the package 10 in FIG. 1F may be replaced by the die 1101, the die 1102, or the die 1103. The schematic cross-sectional views of FIG. 4A, FIG. 5A and FIG. 6A may be taken along the line I-I of FIG. 2A (extending across multiple strip patterns 117A) or along one of the lines I-I and III-III of FIG. 2B (extending across multiple micro-pillars 117B). Similarly, the schematic cross-sectional views of FIG. 4B, FIG. 5B, and FIG. 6B may be taken along the line II-II of FIG. 2A or along one of the lines II-II and IV-IV of FIG. 2B (along the bottom of the strip micro-trenches 120A or meshed micro-trenches 120B, avoiding the discontinuous patterns 117).

Figure 4B:
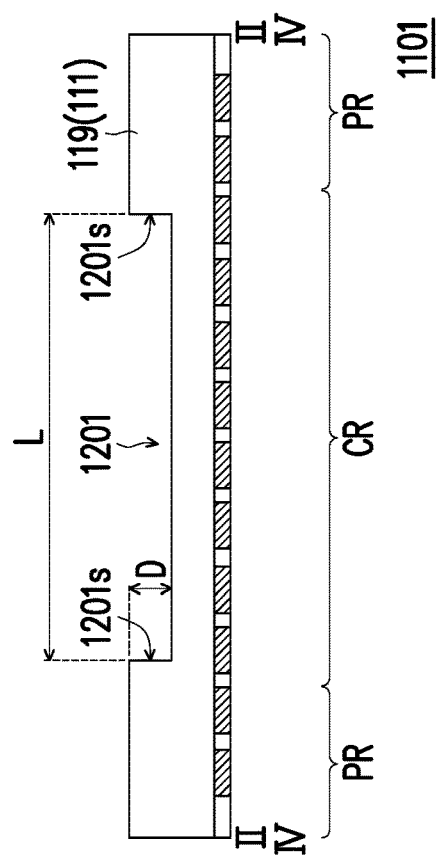
FIG. 4A and FIG. 4B are respectively schematic cross-sectional views of a die according to some embodiments of the present disclosure.
Figure 4A:
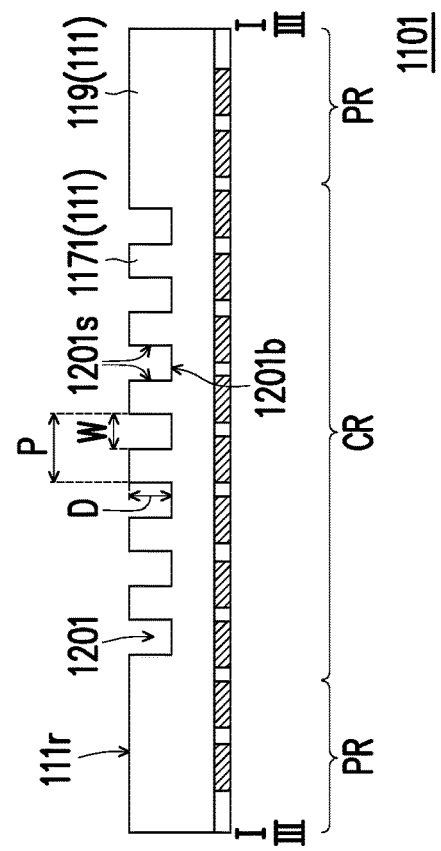

Referring to FIG. 4A and FIG. 4B, the micro-trenches 1201 of the die 1101 are formed by dry etching. In some embodiments, the micro-trenches 1201 may be strip micro-trenches 120A in FIG. 2A or meshed micro-trenches 120B in FIG. 2B. In some embodiments, the micro-trenches 1201 are formed by applying a patterned mask (not shown) on the rear surface 111r of the die 1101 followed by deep reactive-ion etching (DRIE). In some embodiments, the patterned mask covers the peripheral region PR of the die 1101 and portions of semiconductor substrate 111 which later form the discontinuous patterns 1171. Meanwhile, the patterned mask exposes parts of the cooling region CR from which the semiconductor substrate 111 is to be removed in order to form the micro-trenches 1201. After the etching step, the patterned mask may be removed. In some embodiments, forming the micro-trenches 1201 by dry etching may result in a substantially rectangular profile for the micro-trenches 1201. That is, the bottom surfaces 1201b of the micro-trenches 1201 (the surface of the semiconductor substrate 111 exposed at the bottom of the micro-trenches 1201) and the sidewalls 1201s of the micro-trenches 1201 may be substantially straight. In some embodiments, the sidewalls 1201s may join the bottom surface 1201b at a substantially right angle. In some embodiments, the sidewalls 1201s of the micro-trenches 1201 may be considered as side edges of the discontinuous patterns 1171. That is, in some embodiments, the discontinuous patterns 1171 may have substantially straight side edges. In some embodiments, the depth D (a distance between the level height of the rear surface 111r and the level height of the bottom surface 1201b) of the micro-trenches 1201 may be in the range from 5 μm to 700 μm. In some embodiments, a width W (a distance between sidewalls 1201s of one micro-trench 1201 facing each other along a direction perpendicular to an extending direction of the micro-trench 1201) of the micro-trenches 1201 may be in the range from 5 μm to 500 μm. In some embodiments, a pitch P (a distance between corresponding side edges 1201s of immediately adjacent discontinuous patterns 1171) of the discontinuous patterns 1171 may be in the range from 6 μm to 1000 μm. In some embodiments, a length L of a micro-trench 1201 may be measured as a distance between sidewalls 1201s of the micro-trench 1201 facing each other along the extending direction of the micro-trench 1201 (e.g., perpendicular to the measuring direction of the width W). In some embodiments, the length L of the micro-trench 1201 may be approximately 85% of the length of the die 1101 along the same direction. For example, the length L of the micro-trench 1201 may be in the range from 5 mm to 29 mm.

Figure 5B:
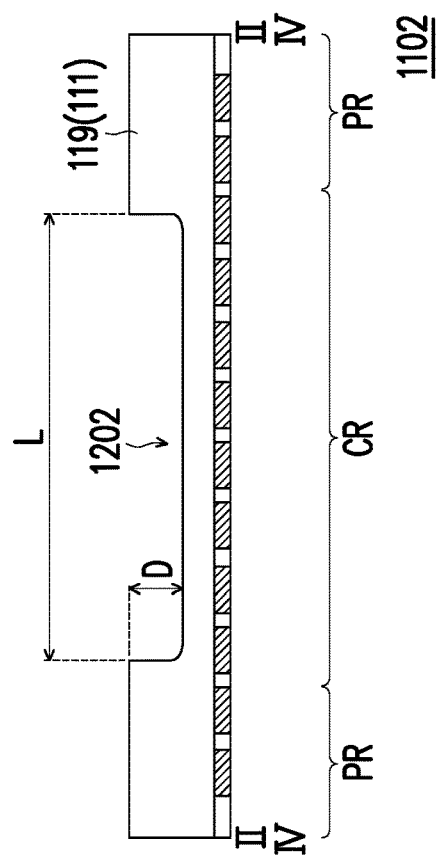
FIG. 5A and FIG. 5B are respectively schematic cross-sectional views of a die according to some embodiments of the present disclosure.
Figure 5A:
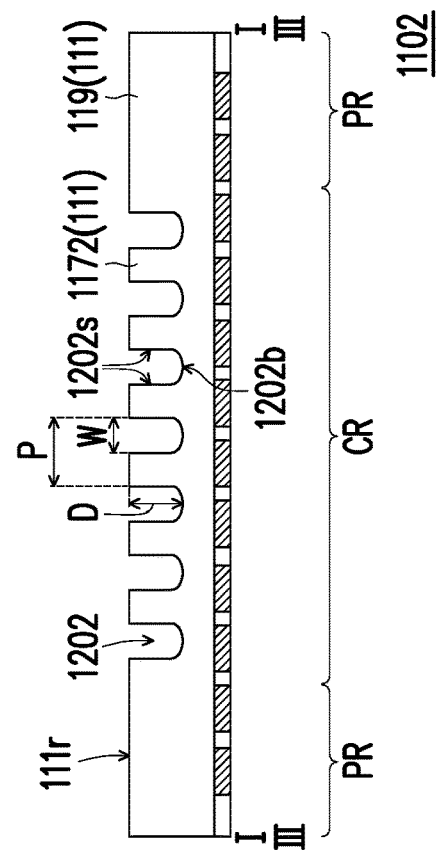

Referring to FIG. 5A and FIG. 5B, the micro-trenches 1202 of the die 1102 are formed by a cutting process employing a mechanical die saw. In some embodiments, the micro-trenches 1202 may be strip micro-trenches 120A in FIG. 2A or meshed micro-trenches 120B in FIG. 2B. In some embodiments, the strip micro-trenches may be obtained by removing a portion of the semiconductor substrate 111 through mechanical die saw. In some embodiments, the meshed micro-trenches may be obtained by forming micro-trenches along a first direction (e.g., the micro-trenches 121 of FIG. 2B) and then forming micro-trenches along one or more directions intersecting the first direction (e.g., the micro-trenches 122 of FIG. 2B) through mechanical die sawing. In some embodiments, when the micro-trenches 1202 are formed with a mechanical die saw, the sidewalls 1202s of the micro-trenches 1202 may be substantially straight, while the bottom surfaces 1202b may have a curved profile. In some embodiments, the angle at the joint between the sidewalls 1202s and a bottom surface 1202b of a micro-trench 1202 may be larger than 90 degrees. That is, in the die 1102, the discontinuous patterns 1172 may be larger at the base (where they emerge from the semiconductor substrate 111) and narrows down to a substantially constant width toward the top (e.g., at the level height of the rear surface 111r). In some embodiments, the ranges for the depth D, the pitch P, the width W, and the length L of the micro-trenches 1202 may be similar to the ranges for the depth D, the pitch P, the width W, and the length L of the micro-trenches 1201 in FIG. 4A and FIG. 4B. As illustrated in FIG. 5A and FIG. 5B, the depth D of the micro-trench 1202 may be considered as a distance from the level height of the rear surface 111r to a bottommost point of the micro-trench 1202. In other words, the depth D of the micro-trench 120 is the maximum depth of the micro-trenches 1202. The pitch P, the width W and the length L may be considered similarly to what was previously discussed with reference to FIG. 4A and FIG. 4B. In some embodiments, a surface roughness (arithmetic average roughness) of the sidewalls 1202s of the micro-trenches 1202 is in the range from 5 μm to 1000 μm.

Referring to FIG. 6A and FIG. 6B, the micro-trenches 1203 of the die 1103 are formed by a cutting process employing a laser saw. In some embodiments, the micro-trenches 1202 may be strip micro-trenches 120A in FIG. 2A or meshed micro-trenches 120B in FIG. 2B. In some embodiments, the strip micro-trenches may be obtained by removing a portion of the semiconductor substrate 111 through laser saw. In some embodiments, the meshed micro-trenches may be obtained by forming micro-trenches along a first direction (e.g., the micro-trenches 121 of FIG. 2B) and then forming micro-trenches along one or more directions intersecting the first direction (e.g., the micro-trenches 122 of FIG. 2B) through laser saw. In some embodiments, when the micro-trenches 1202 are formed with a laser saw, the sidewalls 1203s of the micro-trenches 1203 may be slanted and the bottom surfaces 1203b may have a curved profile. In some embodiments, the angle at the joint between the sidewalls 1203s and a bottom surface 1203b of a micro-trench 1203 may be larger than 90 degrees. Furthermore, an angle α between the level height of the rear surface 111r and the sidewalls 1203s of a micro-trench 1203 may be in the range from 45 to 90 degrees. That is, in the die 1103, the discontinuous patterns 1173 may have the shapes of truncated solids (frusta), larger at the base and narrowing towards the top (e.g., at the level height of the rear surface 111r). In some embodiments, the ranges for the depth D, the pitch P, the width W and the length L of the micro-trenches 1203 may be similar to the depth D, the pitch P, the width W, and the length L of the micro-trenches 1201 in FIG. 4A and FIG. 4B. In some embodiments, a surface roughness (arithmetic average roughness) of the sidewalls 1203s of the micro-trenches 1203 is in the range from 5 μm to 1000 μm.

Figure 7D:
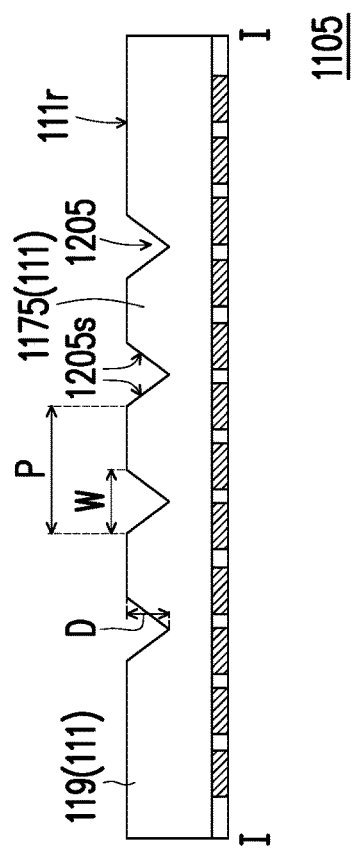
Figure 7C:
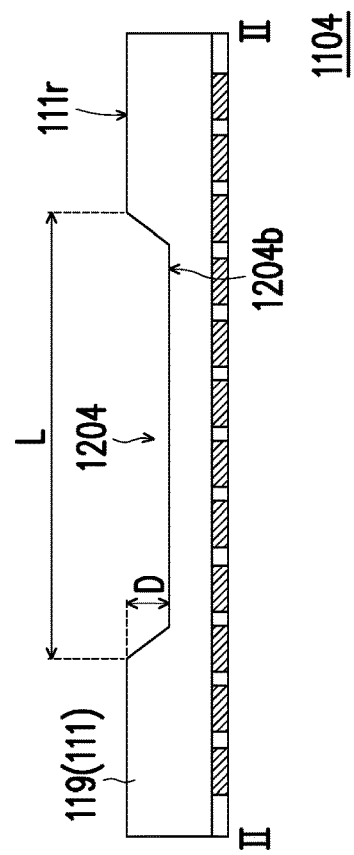

FIG. 7A is a schematic top view of a die 1104 according to some embodiments of the present disclosure. FIG. 7B and FIG. 7C are respectively schematic cross-sectional views of the dies 1104 taken along the lines I-I and II-II of FIG. 7A according to some embodiments of the disclosure. In some embodiments, the micro-trenches 1204 are formed in the die 1104 via a wet etching process. In some embodiments, a patterned auxiliary mask (not shown) may be disposed on the semiconductor substrate 111 before applying the etchant. The patterned auxiliary mask may include openings exposing the regions from which portions of the semiconductor substrate 111 are removed to form the micro-trenches 1204. In some embodiments, the shape of the micro-trenches may be determined by the material of the semiconductor substrate 111 and the composition of the etchant used. For example, when the semiconductor substrate 111 is made of crystalline silicon, the etchant may include KOH, and the micro-trenches 1204 may be formed exposing the (111) surface (miller index) of the silicon. That is, the sidewalls 1204s of the micro-trenches 1204 may inclinedly joint with each other at the bottom of the micro-trenches 1204, and the bottom surface 1204b of the micro-trenches 1204 may correspond to the joint of the two sidewalls 1204s. In some embodiments, the bottom surface 1204b has a substantially straight profile. Furthermore, sidewalls 1204s of adjacent micro-trenches 1204 may directly joint with each other, resulting in the discontinuous patterns 1174 having a prismatic shape with a triangular base. That is, the discontinuous patterns 1174 may include strip patterns having a triangular prismatic shape extending parallel to each other. In some embodiments, facing sidewalls 1204s of two adjacent strip patterns 1174 may constitute the sidewalls 1204s of a micro-trench 1204 separating the adjacent strip patterns 1174. In these embodiments, the width W of the micro-trenches 1204 and the pitch P of the micro-trenches 1204 may coincide, and be measured as a distance between the tips of adjacent strip patterns 1174. However, the disclosure is not limited thereto. FIG. 7D is a schematic cross-sectional view of a die 1105 according to some alternative embodiments. The cross-sectional view of FIG. 7D may be taken along a position corresponding to the line I-I of FIG. 7A. In the die 1105, the micro-trenches 1205 were also formed via wet etching, the discontinuous patterns 1175 may be trapezoidal prisms, and the pitch P may be greater than the width W of the micro-trenches 1205.

Figure 8A:
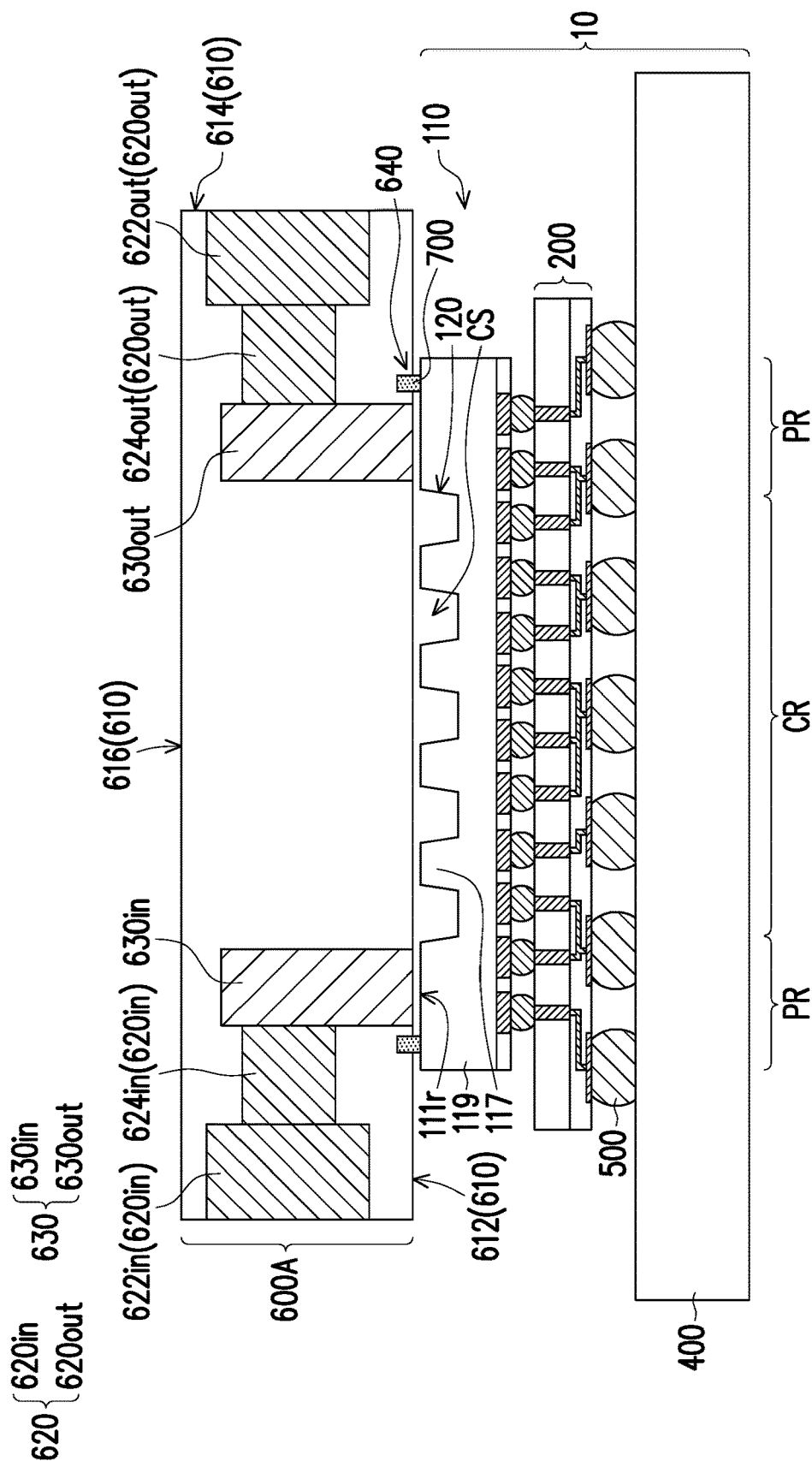
FIG. 8A is a schematic cross-sectional view illustrating a semiconductor device according to some embodiments of the present disclosure.

FIG. 8A is a schematic cross-sectional view of a semiconductor device 15 according to some embodiments of the disclosure. In some embodiments, the semiconductor device 15 includes the package 10 and a cooling cover 600A stacked on the package 10. In some embodiments, the interposer 200, the die 110 and the cooling cover 600A are sequentially stacked on the substrate 400 of the package 10. In some embodiments, the cooling cover 600A faces the rear surface 111r of the die 110. In some embodiments, the cooling cover 600A extends over the cooling region CR and part or all of the peripheral region PR. In some embodiments, the cooling cover 600A includes a casing 610 and fluid ports 620. In some embodiments, the casing includes a floor panel 612, side panels 614, and, optionally, a ceiling panel 616. In some embodiments, the floor panel 612, the side panels 614, and the ceiling panel 616 may be assembled together to form the casing 610. For example, the side panels 614 may join the floor panel 612 with the ceiling panel 616. In some embodiments the fluid ports 620 include a fluid inlet port 620in and a fluid outlet port 620out. In some embodiments, the cooling cover 600A is disposed with the floor panel 612 facing the rear surface 111r of the die 110. The floor panel 612 and the rear surface 111r of the die 110 may form a circulation space CS therebetween in which the micro-trenches 120 and the discontinuous patterns 117 are located. In some embodiments, the fluid ports 620 are connected to fluid channels 630. In some embodiments, the fluid ports 620 include a fluid inlet port 620in and fluid outlet port 620out. Similarly, the fluid channels 620 include a fluid inlet channel 630in and a fluid outlet channel 630out. In some embodiments, the fluid channels 630 extend at least partially over the cooling region CR. As such, the fluid ports 620 and the fluid channels 630 are in fluid communication with the circulation space CS and the micro-trenches 120. In some embodiments, the fluid ports 620 have an opening on the side panels 614. For example, the fluid ports 620 open in opposite side panels 614 (non-adjacent side panels 614 facing each other), and are connected to the floor panel 612 by the fluid channels 630. That is, the fluid inlet port 620in may be connected to the floor panel 612 by the fluid inlet channel 630in, and the fluid outlet port 620out may be connected to the floor panel 612 by the fluid outlet channel 630out. In some embodiments, the fluid inlet port 620in may include an interface pipe 622in opening in one of the side panels 614, and a connection pipe 624in joining the interface pipe 622in with the fluid inlet channel 630in. In some embodiments, a cross-sectional area of the interface pipe 622in may be larger than a cross-sectional area of the connection pipe 624in. In some embodiments, the interface pipe 622in and the connection pipes 624in may be circular pipes. In some alternative embodiments, the interface pipe 622in and the connection pipes 624in may be rectangular pipes. In some embodiments, the fluid outlet port 620out has a similar structure as the fluid inlet port 620in. That is, the fluid outlet port 620out has an interface pipe 622out and a connection pipe 624out. In some embodiments, the interface pipes 622in, 622out and the connection pipes 624in, 624out extend along a first direction. In some embodiments, the first direction is normal to the side panels 614 in which the fluid ports 620 open. In some embodiments, the fluid channels 630 extend along a second direction different from the first direction. In some embodiments, the second direction is parallel to the planes of the side panels 614. In some embodiments, the second direction is normal to the floor panel 612. For example, the second direction is perpendicular to the first direction.

In some embodiments, the floor panel 612 includes a seal trench 640 accommodating a seal ring 700. In some embodiments, the seal ring 700 is disposed between the cooling cover 600A and the die 110 to seal the circulation space CS. In some embodiments, the seal ring 700 is disposed on the continuous ring pattern 119 in the peripheral region PR. In some embodiments, the fluid ports 620 and/or the fluid channel 630 opens in an area of the floor panel 612 enclosed by the seal trench 640. In some embodiments, the seal ring 700 may include an adhesive material and may secure the cooling cover 600A to the die 110. In some embodiments, sealing of the circulation space CS via the seal ring 700 facilitates installation and replacement of the cooling cover 600A.

It should be noted that although FIG. 8A illustrated that the CoWoS package 10 is attached to the cooling cover 600A, the disclosure is not limited thereto. In some alternative embodiments, other types of packages 10 may be assembled with the cooling cover 600A. For example, an integrated fan-out (InFO) package may also be assembled with the cooling cover 600 in some alternative embodiments.

Figure 8B:
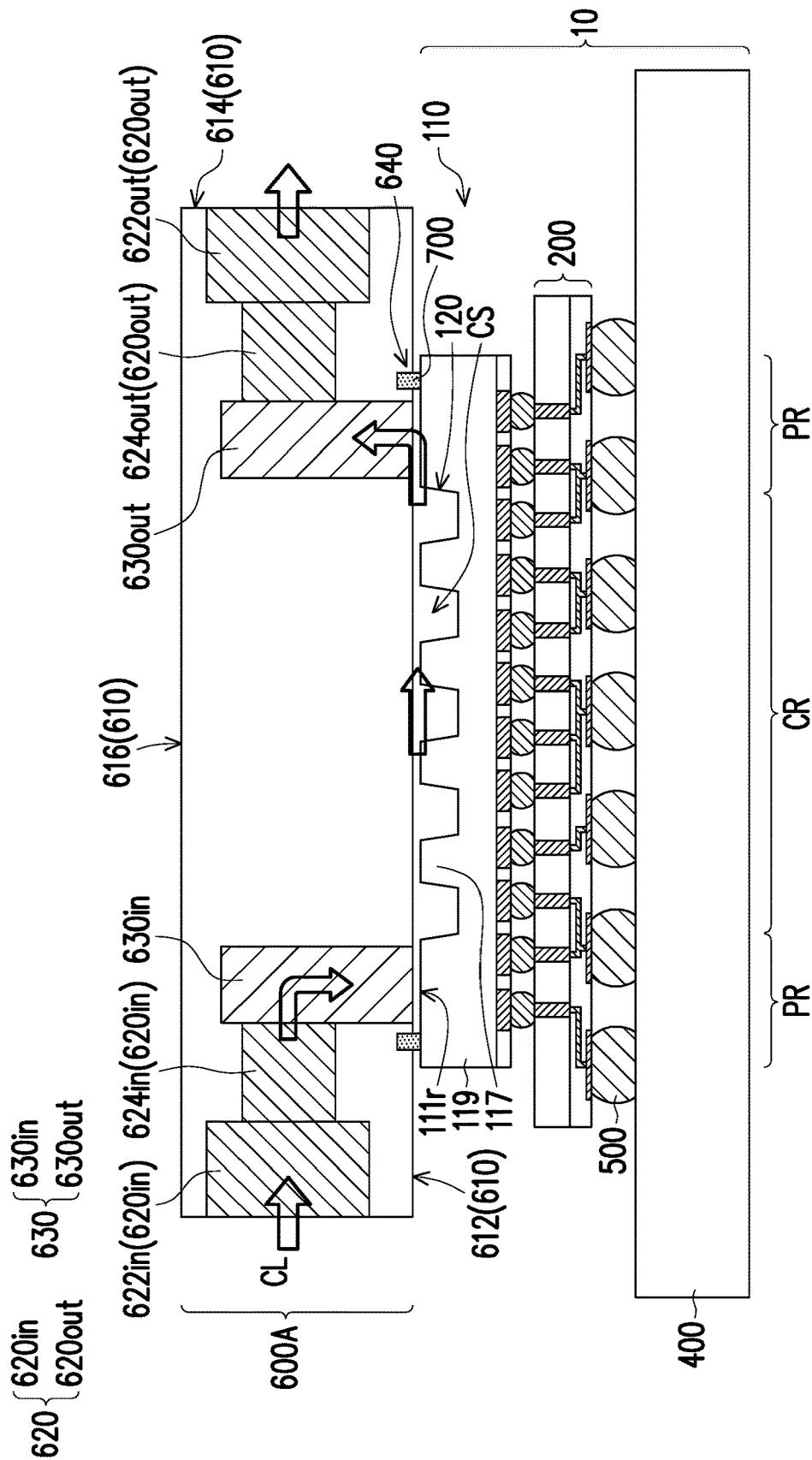
FIG. 8B is a schematic cross-sectional view of a semiconductor device in use according to some embodiments of the present disclosure.
Figure 8C:
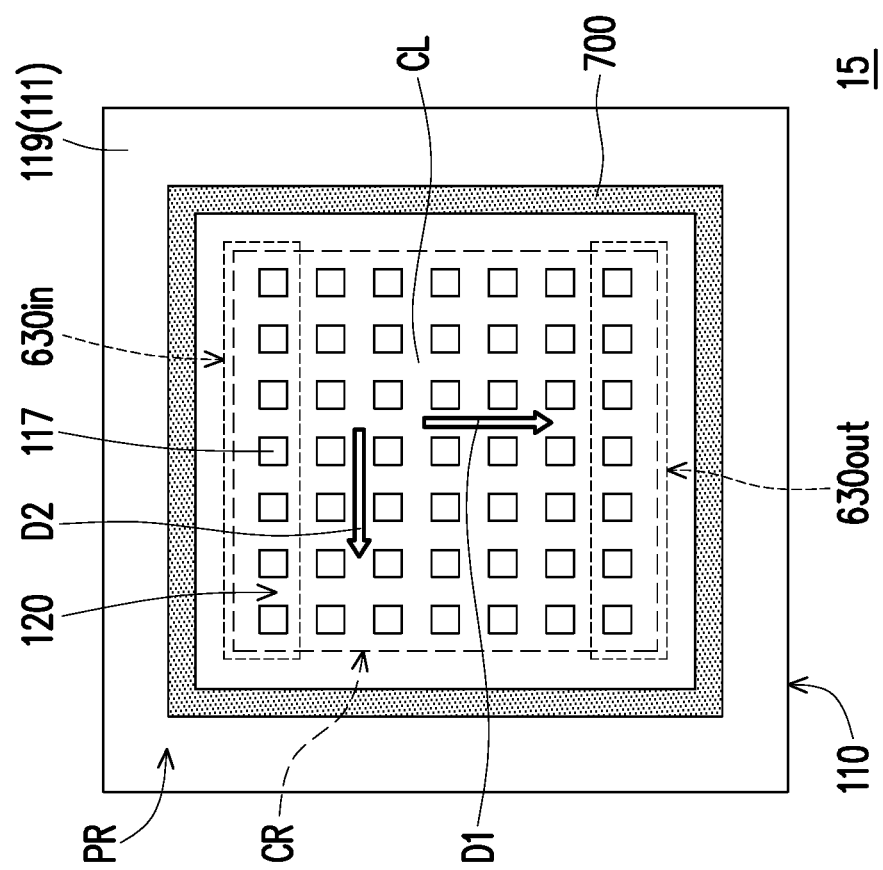
FIG. 8C is a schematic top view of a semiconductor device in use according to some embodiments of the present disclosure.

FIG. 8B is a schematic cross-sectional view of the semiconductor device 15 in use according to some embodiments of the present disclosure. FIG. 8C is a schematic top view of the semiconductor device 15 in use according to some embodiments of the present disclosure. In some embodiments, FIG. 8B and FIG. 8C illustrate the semiconductor device 15 with a cooling fluid CL (schematically represented by arrows) flowing therethrough. It should be noted that while in FIG. 8C the micro-trenches 120 are meshed micro-trenches (similar to the die 110B of FIG. 2B), the disclosure is not limited thereto. In some alternative embodiments, the semiconductor device 15 may include a die 110 having micro-trenches 120 and discontinuous patterns 117 according to any of the embodiments disclosed above, for examples, strip micro-trenches similar to the die 110A of FIG. 2A.

In some embodiments, the cooling fluid CL is a coolant. In some embodiments, the cooling fluid CL is a water-based coolant. In some embodiments, additives are added to water to produce the cooling fluid CL. Examples of additives include surfactants, corrosion inhibitors, biocides, antifreeze, and the like. In some embodiments, the cooling fluid CL may enter the cooling cover 600A from the fluid inlet port 620in. In some embodiments, the fluid inlet port 620in and the fluid outlet port 620out is connected to a cooling system (not shown) which may include a pump and a heat dissipator joined by a piping system. The interface pipes 622in and 622out may be joint to the piping system of the cooling system. The pump may propel the cooling fluid CL to the cooling cover 600A through the fluid inlet port 620. For example, the cooling fluid CL may enter the semiconductor device 15 through the interface pipe 622in. Thereafter, the cooling fluid CL travels through the connecting pipe 624in to the fluid inlet channel 630in. Then, the cooling fluid CL passes through the fluid inlet channel 630in to arrive at the cooling space CS. In the cooling space CS, the cooling fluid CL may directly contact the cooling region CR of the die 110. For example, the cooling fluid CL may run over the rear surface 111r of the die 110. In some embodiments, the cooling fluid CL may enter one end of the micro-trenches 120, run through the micro-trenches 120, and leave the micro-trenches 120 from the other end of the micro-trenches 120. For example, as illustrated in FIG. 8C, when the micro-trenches 120 are meshed micro-trenches formed by intersecting strip micro-trenches extending along two directions (as illustrated for the die 110B of FIG. 2B), a first flowing direction D1 of the cooling fluid CL may be parallel to one of the extending directions of the strip micro-trenches. However, the cooling fluid may also flow along a second direction D2 in the strip micro-trenches extending in the intersecting direction. In some embodiments, the fluid inlet channels 630in and the fluid outlet channels 630out may have an elongated shape, with an elongation direction skewed with respect to an extending direction of the micro-trenches 120. In some embodiments, the elongation direction of the fluid inlet channel 630in and the fluid outlet channel 630out may be perpendicular to the extending direction of at least some of the micro-trenches 120. In some embodiments, the fluid inlet channel 630in and the fluid outlet channel 630out may open across multiple discontinuous patterns 117 and multiple micro-trenches 120. In some embodiments, the cooling fluid CL may overfill the micro-trenches 120 and also cover the discontinuous patterns 117. After leaving the micro-trenches 120, the cooling fluid CL may run through the fluid outlet channel 630out and leave the semiconductor device 15 from the fluid outlet port 620out.

In some embodiments, the temperature of the die 110 may increase during usage. In some embodiments, the temperature of the die 110 during usage may be higher than the temperature of the cooling cover 600A and the temperature of the cooling fluid CL. In some embodiments, heat exchange may take place between the cooling fluid CL and the die 110 when the cooling fluid CL runs over the die 110. For example, the cooling fluid CL may be warmed up by contacting with the die 110, so that a temperature of the cooling fluid CL at the fluid outlet port 620out may be higher than a temperature of the cooling fluid CL at the fluid inlet port 620in. In some embodiments, the cooling fluid CL may re-enter into the piping system of the cooling system through the fluid outlet port 620out. In some embodiments, the cooling fluid CL may be cooled by the heat dissipator before being pumped back into the semiconductor device 15. In some embodiments, the cooling fluid CL is in direct contact with the semiconductor substrate 111. That is, the heat exchange between the cooling fluid CL and the semiconductor substrate 111 may be realized without an intermediate thermal interface material (TIM). In some embodiments, elimination of the thermal path through the TIM may improve the thermal resistance of the semiconductor device 15.

Figure 9A:
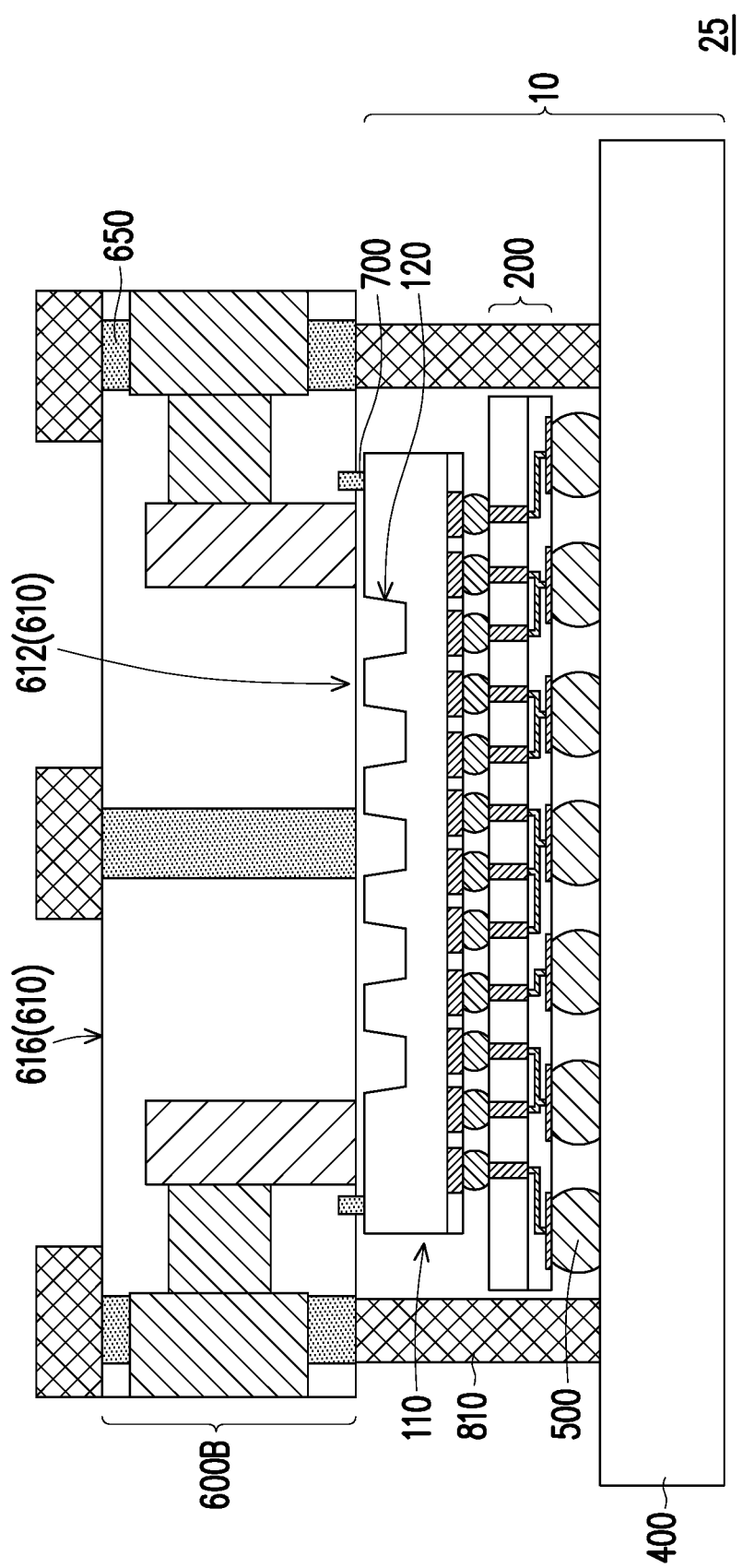
FIG. 9A is a schematic cross-sectional view of a semiconductor device according to some embodiments of the present disclosure.

FIG. 9A is a schematic cross-sectional view of a semiconductor device 25 according to some embodiments of the disclosure. The semiconductor device 25 includes the package 10 and a cooling cover 600B. The semiconductor device 25 in FIG. 9A is similar to the semiconductor device 15 in FIG. 8A, so the detailed description thereof is omitted herein. In some embodiments, the semiconductor device 25 further includes screws 810 and the cooling cover 600B further includes vertical pipes 650 penetrating through the ceiling panel 616 and the floor panel 612. In some embodiments, the vertical pipes 650 may be screw holes, and the cover 600B may be secured to the package 10 via screws 810. In some embodiments, the vertical pipes 650 are enclosed channels crossing the casing 610 from the ceiling panel 616 to the floor panel 612. In some embodiments, a head of the screws 810 may rest on the ceiling panel 616 while a thread of the screws may be fastened into the substrate 400 after fitted into a vertical pipe 650. In some embodiments, threaded holes (not shown) may be formed in the substrate 400 to accommodate the threaded ends of the screws 810. In some embodiments, the cooling cover 600B has a larger width than the interposer 200, and the vertical pipes 650 are provided in the cooling cover 600B so as not to overlap with the interposer 200. That is, the screws 810 may be disposed along a peripheral edge of the interposer 200.

Figure 9B:
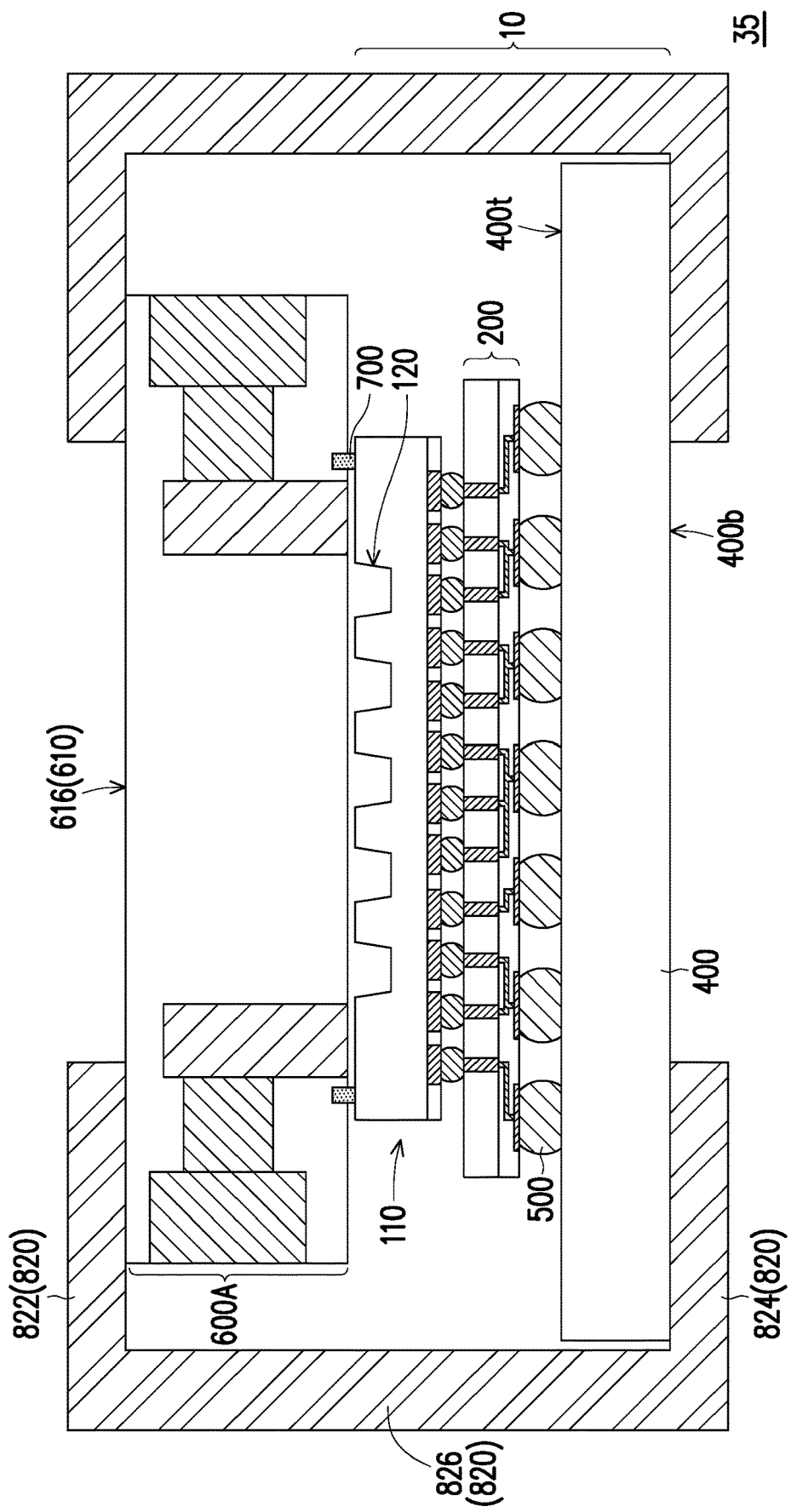
FIG. 9B is a schematic side view of a semiconductor device according to some embodiments of the present disclosure.

FIG. 9B is a schematic cross-sectional view of a semiconductor device 35 according to some embodiments of the disclosure. The semiconductor device 35 in FIG. 9B is similar to the semiconductor device 15 in FIG. 8A, so the detailed description thereof is omitted herein. In some embodiments, the semiconductor device 35 further includes clamps 820. In the semiconductor device 35, the cooling cover 600A may be secured to the package 10 through the application of inward pressure. For example, clamps 820 may be employed to press the cooling cover 600A together with the package 10. In some embodiments, an upper arm 822 of a clamp 820 may rest on the ceiling panel 616 of the cooling cover 600A, and a lower arm 824 of the clamp 820 may make contact with a bottom surface 400b of the substrate 400. The bottom surface 400b of the substrate 400 may be opposite to the top surface 400t on which the package 10 and the cooling cover 600A are stacked. In some embodiments, the upper arm 822 and the lower arm 824 of the clamp 820 may be connected by a clamp body 826. The combined action of the upper arm 822 and the lower arm 824 may firmly secure the cooling cover 600A and the package 10 together. In some embodiments, multiple clamps 820 may be applied to fix the cover 600A to the package 10.

Figure 9C:
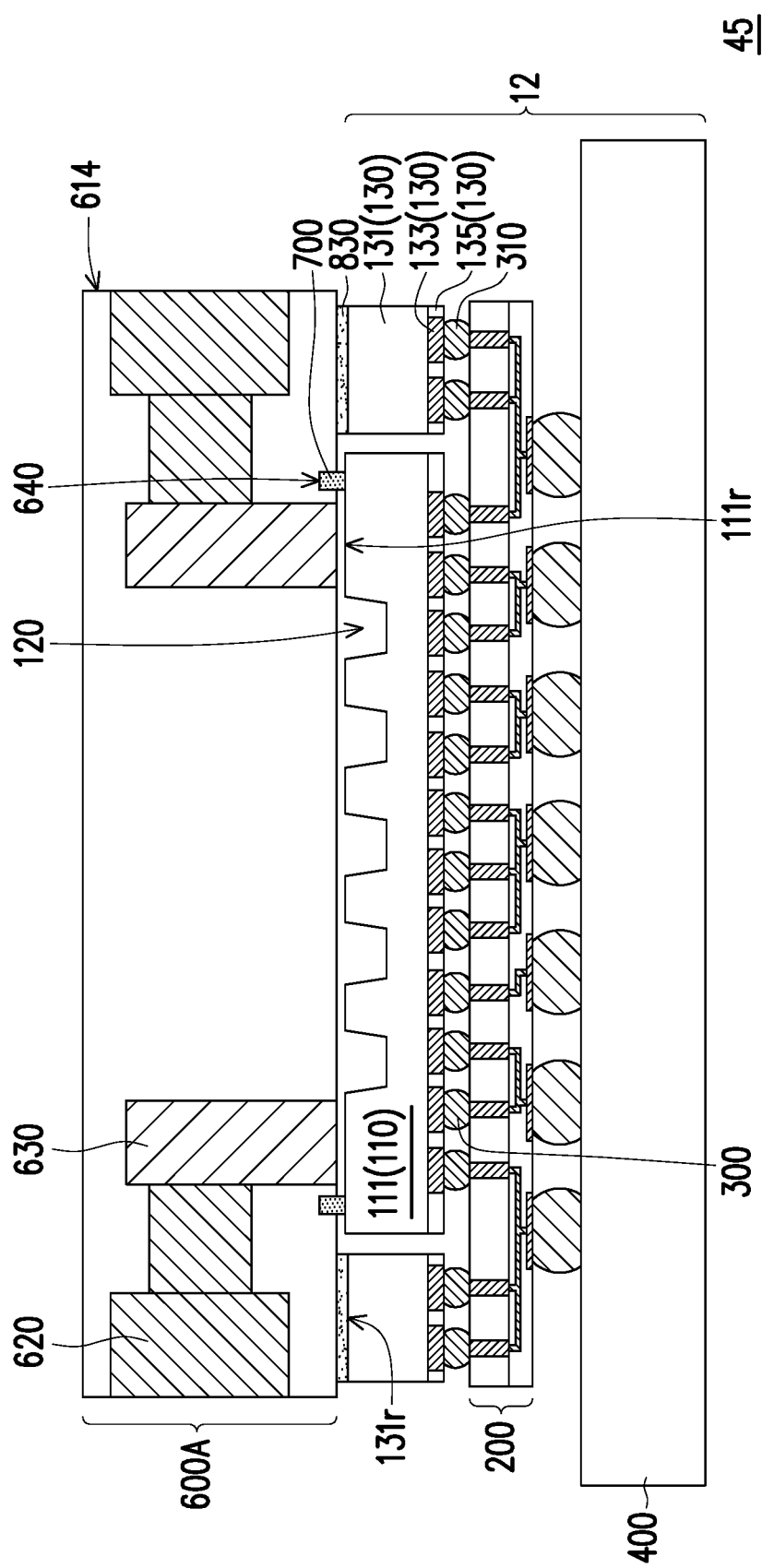
FIG. 9C is a schematic side view of a semiconductor device according to some embodiments of the present disclosure.

FIG. 9C is a schematic cross-sectional view of a semiconductor device 45 according to some embodiments of the disclosure. The semiconductor device 45 in FIG. 9C is similar to the semiconductor device 15 in FIG. 8A, so the detailed description thereof is omitted herein. In some embodiments, the semiconductor device 45 includes the package 12 and the cover 600A stacked on the package 12. The package 12 in FIG. 9C is similar to the package 10 in FIG. 8A, so the detailed description thereof is omitted herein. However, the package 12 further includes dies 130 disposed on the interposer 200 beside the die 110. In some embodiments, the dies 130 includes a semiconductor substrate 131 having contact pads 133 formed on an active surface thereof, and a passivation layer 135 covering the active surface and exposing portions of the contact pads 133. In some embodiments, the dies 130 are disposed with the contact pads 133 facing the interposer 200. In some embodiments, the dies 130 are connected to the interposer 200 via conductive terminals 310. The conductive terminals 310 may establish electrical connection between the contact pads 133 and the interposer 200. In some embodiments, the conductive terminals 310 are micro-bumps. As illustrated in FIG. 9C, rear surfaces 131r of the semiconductor substrates 131 face the cooling cover 600A. In some embodiments, the rear surfaces 131r of the semiconductor substrates 131 may be substantially flat. In some embodiments, the semiconductor device 45 further includes thermal dissipation layers 830 formed on the rear surfaces 131r of the dies 130. In some embodiments, the thermal dissipation layers 830 may include a thermal interface material (TIM). In some embodiments, the TIM is an adhesive material. In some embodiments, the TIM includes grease-based materials, phase change materials, gels, adhesives, polymeric, metallic materials, or a combination thereof. In some embodiments, the TIM includes lead-tin based solder (PbSn), silver paste (Ag), gold, tin, gallium, indium, or other suitable thermally conductive materials. Depending on the type of material used, the TIM may be formed by deposition, lamination, printing, plating, or any other suitable technique. In some embodiments, the TIM is a gel type material. In some embodiments, the TIM is a film type material (e.g., carbon nanotubes or graphite). In some embodiments, the cooling cover 600A is adhered to the dies 130 of the package 12 via the thermal dissipation layers 830. In some embodiments, the dies 130 may be disposed below a region of the cooling cover 600A outside of the region encircled by the seal trench 640. In some embodiments, the heat generated by the dies 130 during operation of the semiconductor device 45 may be dissipated through the thermal dissipation layers 830.

Figure 10A:
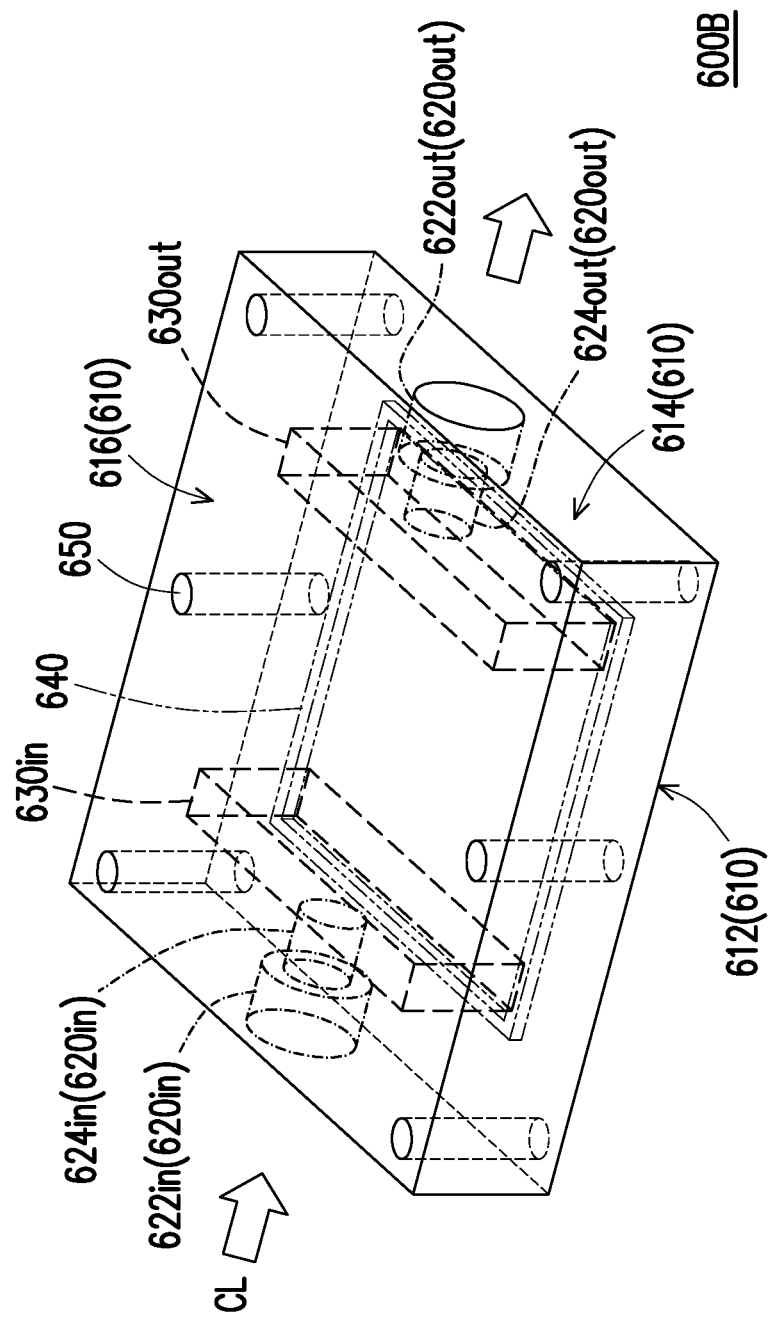

FIG. 10A to FIG. 10D are respectively schematic perspective views of the cooling covers 600B, 600C, 600D, and 600E according to some embodiments of the disclosure. In some embodiments, the cooling cover 600A or cooling cover 600B in FIGS. 8A, 9A, 9B, and 9C may be replaced by the cooling cover 600C, the cooling cover 600D, or the cooling cover 600E. In the perspective views of FIG. 10A to FIG. 10D, components of the corresponding cooling covers are shown even though the panels 612, 614, 616 of the casing 610 may not necessarily be transparent. Referring to FIG. 10A, the cooling cover 600B of FIG. 9A is shown. As illustrated in FIG. 10A, the fluid inlet port 620in and the fluid outlet port 620out may open on opposite side panels 614 of the casing 610. In some embodiments, the fluid inlet port 620in and the fluid outlet port 620out are connected to the fluid inlet channel 630in and the fluid outlet channel 630out, respectively. The seal trench 640 formed in the floor panel 612 may encircle the fluid inlet channel 630in and the fluid outlet channel 630out, and may run below the fluid inlet port 620in and the fluid outlet port 620out. The vertical pipes 650 may from channels penetrating through the cooling cover 600B from the floor panel 612 to the ceiling panel 616, and may be designed to accommodate screws (e.g., screws 810 shown in FIG. 9A) to secure the cooling cover 600B to the underlying package (e.g., the package 10 in FIG. 9A).

FIG. 10B is a schematic perspective view of a cooling cover 600C according to some embodiments of the disclosure. The cooling cover 600C in FIG. 10B is similar to the cooling cover 600B in FIG. 10A, so the detailed description thereof is omitted herein. However, the cooling cover 600C may include multiple fluid ports 620 having openings in the side panels 614 and multiple fluid channels 630 having openings in the floor panel 612. For examples, the cooling cover 600C includes four fluid ports 6201, 6202 having openings in one of the side panels 614, and four fluid ports 6203, 6204 having openings in a side panel 614 opposite to the side panel in which the fluid ports 6201 and 6202 opens. In some embodiments, the fluid ports 620 may be located at different level heights. For example, two fluid ports 6201 and two fluid ports 6203 may open at a first level height closer to the floor panel 612 than the fluid ports 6202 and 6204, which may be located at a second level height closer to the ceiling panel 616. In some embodiments, the fluid ports 620 may be connected to different fluid channels 630 according to the level heights at which they are located and/or the side panel 614 in which they are opened. For example, the cooling cover 600C may include three fluid channels 630, two of which (6301 and 6303) reach above the first level height without reaching the second level height and one of which (6302) reaches above the second level height. The three fluid channels 630 may all have openings in the floor panel 612 within a region enclosed by the seal trench 640. In some embodiments, the fluid channel 6302 reaching the second level height is located between the two fluid channels 6301, 6303 not reaching the second level height, and is connected to the fluid ports 6202, 6204 located at the second level height. In some embodiments, the fluid channels 6301, 6303 not reaching the second level height are connected with the fluid ports 6201, 6203 located at the first level height. That is, the fluid port 6201 and the fluid channel 6301 are located on one side of the fluid channel 6302 and are directly connected to each other, while the fluid port 6203 and the fluid channel 6303 are located on opposite side of the fluid channel 6302 and are directly connected to each other. In some embodiments, the fluid ports 6201, 6203 located at the first level height may be used as fluid inlet ports. On the other hand, the fluid ports 6202, 6204 located at the second level height may be used as fluid outlet port. However, the disclosure is not limited thereto. In some alternative embodiments, the fluid inlet ports may be the fluid ports 6202, 6204 located at the second level height, and the fluid outlet ports may be the fluid ports 6201, 6203 located at the first level height.

Figure 10C:
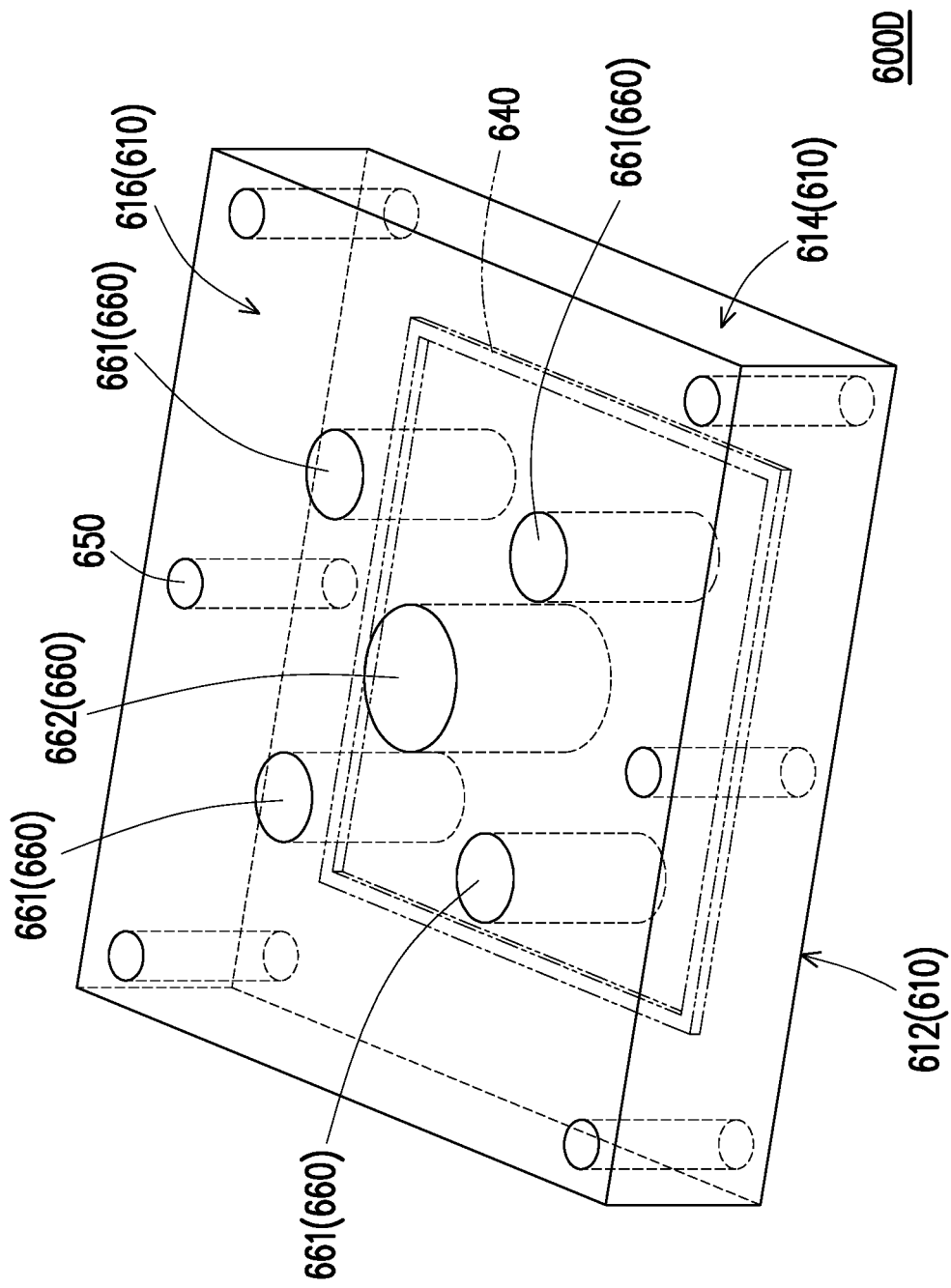

FIG. 10C is a schematic perspective view of a cooling cover 600D according to some embodiments of the disclosure. The cooling cover 600D may include a plurality of vertical pipes 650, 660 which have on one end opening in the floor panel 612 and another end opening in the ceiling panel 616. In some embodiments, the vertical pipes 650 are used as screw holes. In some embodiments, the vertical pipes 650 are located in a region outside of the enclosure of the seal trench 640. In some embodiments, the vertical pipes 660 are fluid ports and are located in a region enclosed by the seal trench 640. In some embodiments, the vertical pipes 660 include pipes of different diameters. For example, the vertical pipes 660 may include narrower fluid ports 661 and wider fluid ports 662. In some embodiments, the narrower fluid ports 661 are disposed towards the corners of the region enclosed by the seal trench 640, and the wider fluid port 662 are disposed at the center of the region enclosed by the seal trench 640. However, the disclosure is not limited thereto. In some embodiments, a diameter of the narrower fluid ports 661 is smaller than a diameter of the wider fluid ports 662. In some embodiments, the wider fluid ports 662 may be used as fluid inlet ports, and the narrower fluid ports 661 may be used as fluid outlet ports. However, the disclosure is not limited thereto. In some embodiments, the fluid inlet ports and the fluid outlet ports may having openings in the ceiling panel 616 rather than in the side panels 616. In some embodiments, the fluid inlet ports and the fluid outlet ports may be directly connected to the floor panel 612 without intervening fluid channels.

Figure 10D:
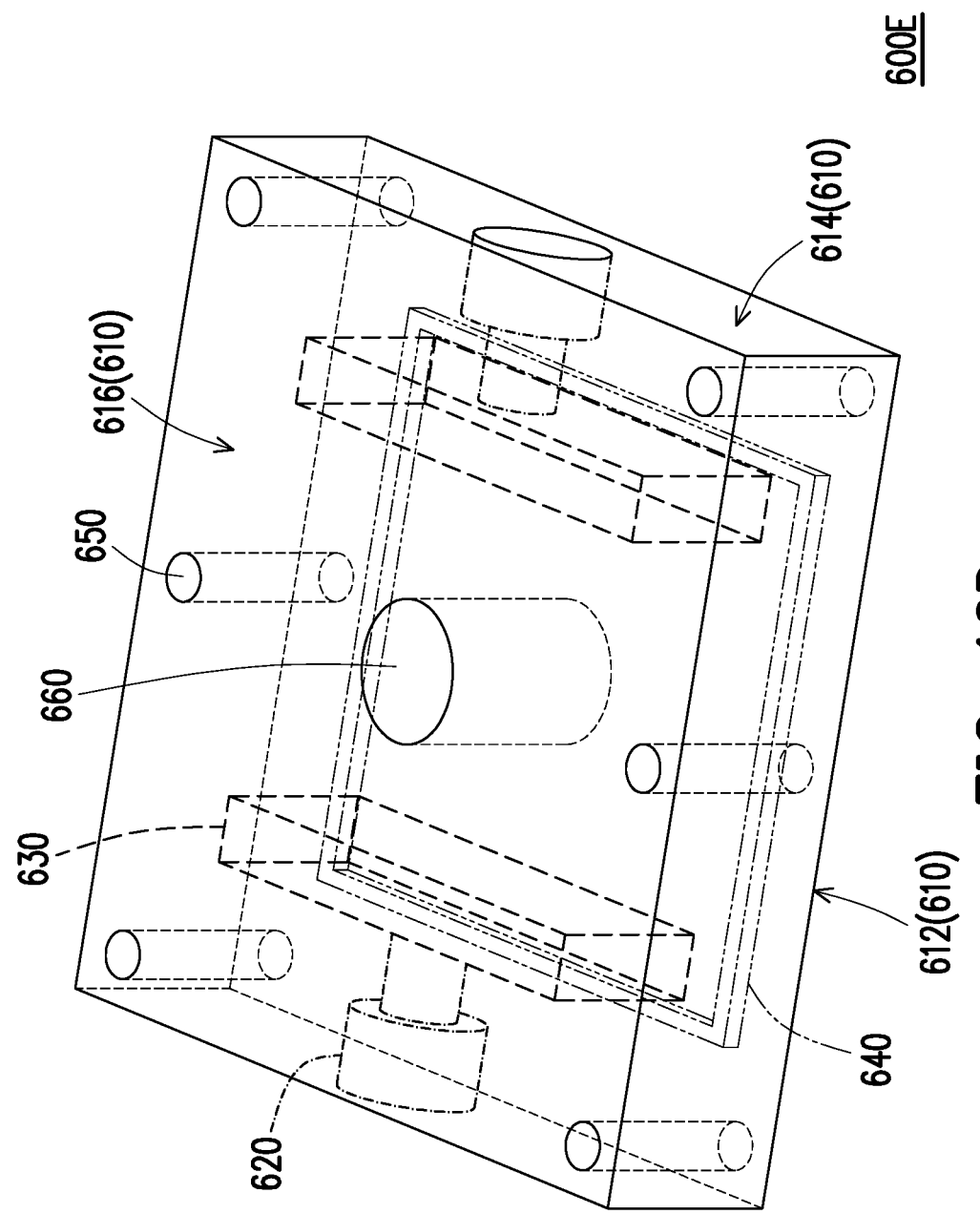

FIG. 10D is a schematic perspective view of a cooling cover 600E according to some embodiments of the disclosure. The cooling cover 600E in FIG. 10D is similar to the cooling cover 600B in FIG. 10A, so the detailed description thereof is omitted herein. However, the cooling cover 600E further includes a vertical pipe 660 having opening in the ceiling panel 616 of the casing 610. In some embodiments, the vertical pipe 660 is located in the region enclosed by the seal trench 640. In some embodiments, the fluid ports 620 may be connected to fluid channels 630 while the vertical pipe 660 may directly open in the floor panel 612 without intervening fluid channels. In some embodiments, the fluid ports 620 may be used as fluid inlet ports and the vertical pipe 660 may be used as a fluid outlet port. In some alternative embodiments, the fluid ports 620 may be used as fluid outlet ports and the vertical pipe 660 may be used as fluid inlet port.

Based on the above, a semiconductor device includes a package and a cooling cover disposed on the package. In some embodiments, the cooling cover allows flow of a coolant directly in contact with the package, thereby eliminating the usage of thermal interface material. In some embodiments, the direct contact of the coolant with the package ensures efficient thermal exchange, providing a cooling effect for the package. In some embodiments, the cooling cover and the package form a circulation space through which the coolant flows. Moreover, with the formation of the micro-trenches on a rear surface of a die of the package, the coolant may flow through the micro-trenches, thereby enhancing the heat dissipation efficiency of the semiconductor device.

In some embodiments of the present disclosure, a semiconductor device includes a package and a cooling cover. The package includes a first die having an active surface and a rear surface opposite to the active surface. The rear surface has a cooling region and a peripheral region enclosing the cooling region. The first die includes micro-trenches located in the cooling region of the rear surface. The cooling cover is stacked on the first die. The cooling cover includes a fluid inlet port and a fluid outlet port located over the cooling region and communicated with the micro-trenches.

In some embodiments of the present disclosure, a semiconductor device includes a package and a cooling cover. The package includes a substrate, an interposer, and a die. The interposer is disposed over and electrically connected to the substrate. The die is disposed over and electrically connected to the interposer. The die includes a continuous ring pattern and discontinuous patterns enclosed by the continuous ring pattern on an upper surface of the die opposite to the interposer. The cooling cover is stacked on the die. The cooling cover includes a fluid inlet port and a fluid outlet port located over the discontinuous patterns.

In some embodiments of the present disclosure, a manufacturing method of a semiconductor device includes at least the following steps. A die is provided. The die has an active surface and a rear surface opposite to the active surface. The rear surface has a cooling region and a peripheral region enclosing the cooling region. Micro-trenches are formed in the cooling region of the rear surface. The die is placed on an interposer such that the active surface of the die faces the interposer. The interposer is placed on a substrate. A cooling cover is attached to the rear surface of the die. The cooling cover includes a fluid inlet port and a fluid outlet port located over the cooling region and communicated with the micro-trenches.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
a package, comprising a first die having an active surface and a rear surface opposite to the active surface, wherein the rear surface has a cooling region and a peripheral region enclosing the cooling region, and the first die comprises micro-trenches located in the cooling region of the rear surface; and
a cooling cover stacked on the first die, wherein the cooling cover comprises a fluid inlet port and a fluid outlet port located over the cooling region and communicated with the micro-trenches, and the cooling cover has a seal trench at a floor panel facing toward the first die; and
a seal ring, filled in the seal trench and in contact with the peripheral region of the first die, wherein a space between the cooling cover and the micro-trenches is sealed by the seal ring.

2. The semiconductor device of claim 1, wherein the seal ring comprises an adhesive material, and the cooling cover is adhered to the first die through the seal ring.

3. The semiconductor device of claim 1, wherein the cooling cover further comprises a fluid inlet channel and a fluid outlet channel, the fluid inlet channel is connected to the fluid inlet port and the fluid outlet channel is connected to the fluid outlet port, the fluid inlet port and the fluid outlet port respectively extend along a first direction, and the fluid inlet channel and the fluid outlet channel respectively extend along a second direction perpendicular to the first direction.

4. The semiconductor device of claim 1, wherein the package further comprises:
an interposer, wherein the first die is stacked on the interposer, and the active surface is electrically connected to the interposer; and
a substrate, wherein the interposer, the first die, and the cooling cover are sequentially stacked on the substrate.

5. The semiconductor device of claim 3, wherein the fluid inlet channel and the fluid outlet channel are laterally surrounded by the seal ring.

6. The semiconductor device of claim 1, further comprising screws, wherein the cooling cover is fixed to the package through the screws.

7. The semiconductor device of claim 1, further comprising clamps, wherein the cooling cover is fixed to the package through the clamps.

8. The semiconductor device of claim 1, wherein the package further comprises second dies aside the first die, the semiconductor device further comprises thermal dissipation layers located between the second dies and the cooling cover, and the thermal dissipation layers comprise thermal interface material (TIM).

9. The semiconductor device of claim 1, wherein bottom surfaces of the micro-trenches are curved.

10. The semiconductor device of claim 1, wherein sidewalls of each micro-trench are slanted.

11. A semiconductor device, comprising:
a package, comprising:
a substrate;
an interposer disposed over and electrically connected to the substrate; and
a die disposed over and electrically connected to the interposer, wherein the die comprises a continuous ring pattern and discontinuous patterns enclosed by the continuous ring pattern on an upper surface of the die opposite to the interposer; and
a cooling cover stacked on the die, wherein the cooling cover comprises a fluid inlet port and a fluid outlet port located over the discontinuous patterns, the cooling cover further comprises a fluid inlet channel connected to the fluid inlet port and a fluid outlet channel connected to the fluid outlet port, and each of the fluid inlet channel and the fluid outlet channel laterally spans to overlap a group of the micro-trenches.

12. The semiconductor device of claim 11, further comprising a seal ring located between the cooling cover and the continuous ring pattern of the die.

13. The semiconductor device of claim 11, wherein the discontinuous patterns comprise strip patterns parallel to each other, and the strip patterns are connected to the continuous ring pattern.

14. The semiconductor device of claim 11, wherein the discontinuous patterns are arranged in an array and are spaced apart from the continuous ring pattern.

15. The semiconductor device of claim 14, wherein the discontinuous patterns are squared patterns, triangular patterns, or diamond-shaped patterns.

16. A manufacturing method of a semiconductor device, comprising:
providing a die having an active surface and a rear surface opposite to the active surface, wherein the rear surface has a cooling region and a peripheral region enclosing the cooling region;
forming micro-trenches in the cooling region of the rear surface;
placing the die on an interposer such that the active surface of the die faces the interposer;
placing the interposer on a substrate; and
attaching a cooling cover to the rear surface of the die, wherein the cooling cover comprises a fluid inlet port and a fluid outlet port located over the cooling region and communicated with the micro-trenches, the cooling cover further comprises a fluid inlet channel connected to the fluid inlet port and a fluid outlet channel connected to the fluid outlet port, and each of the fluid inlet channel and the fluid outlet channel laterally spans to overlap a group of the micro-trenches.

17. The method of claim 16, wherein the micro-trenches are formed before the die is placed on the interposer.

18. The method of claim 16, wherein the micro-trenches are formed after the die is placed on the interposer.

19. The method of claim 16, wherein the micro-trenches are formed by an etching process.

20. The method of claim 16, wherein the micro-trenches are formed by a cutting process.

* * * * *